(12) United States Patent
Hein

(10) Patent No.: US 9,142,269 B2
(45) Date of Patent: Sep. 22, 2015

(54) DATA MASK ENCODING IN DATA BIT INVERSION SCHEME

(71) Applicant: PS4 Luxco S.a.r.l., Luxembourg (LU)

(72) Inventor: Thomas Hein, Munich (DE)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/229,208

(22) Filed: Mar. 28, 2014

(65) Prior Publication Data
US 2014/0215140 A1   Jul. 31, 2014

Related U.S. Application Data

(63) Continuation of application No. 13/223,922, filed on Sep. 1, 2011, now Pat. No. 8,706,958.

(51) Int. Cl.
| | |
|---|---|
| G06F 12/16 | (2006.01) |
| G11C 7/10 | (2006.01) |
| G06F 13/42 | (2006.01) |
| G11C 5/14 | (2006.01) |
| G06F 3/06 | (2006.01) |

(52) U.S. Cl.
CPC .......... *G11C 7/1087* (2013.01); *G06F 13/4243* (2013.01); *G11C 5/148* (2013.01); *G11C 7/1009* (2013.01); *G06F 3/0619* (2013.01); *Y02B 60/1228* (2013.01); *Y02B 60/1235* (2013.01)

(58) Field of Classification Search
CPC ............................ G11C 7/1009; G06F 3/0619
USPC .................................................... 711/104, 154
See application file for complete search history.

(56) References Cited

U.S. PATENT DOCUMENTS

| | | | |
|---|---|---|---|
| 2002/0184579 A1* | 12/2002 | Alvarez et al. | 714/719 |
| 2004/0210799 A1* | 10/2004 | Cargnoni et al. | 714/42 |
| 2008/0115030 A1* | 5/2008 | Hein et al. | 714/752 |

* cited by examiner

*Primary Examiner* — Than Nguyen

(57) ABSTRACT

Devices, circuits, and methods for data mask and data bit inversion encoding and decoding for a memory circuit. According to these methods and circuits, the number of data lines/pins required to encode data mask information and data bit inversion information can be reduced. In an embodiment the data mask and data inversion functions for a portion of data, such as a data word, can be merged onto a common pin/data line. In other embodiments, a data mask instruction can be conveyed through a transmitted data word itself without using any extra pins. According to these embodiments, the pin overhead can be reduced from two pins per byte to one pin per byte.

19 Claims, 19 Drawing Sheets

Fig. 13

| | | Time | | | | | | | | | | |
|---|---|---|---|---|---|---|---|---|---|---|---|---|
| | | Data | T=0 | 1 | 2 | 3 | 4 | 5 | 6 | 7 | 8 | 9 | 10 |
| A | Original data | D7 | | 0 | 1 | 0 | 1 | 0 | 0 | 1 | 0 | 0 | 0 |
| | | D6 | | 0 | 1 | 0 | 1 | 0 | 0 | 1 | 0 | 0 | 0 |
| | | D5 | | 0 | 1 | 0 | 1 | 0 | 0 | 1 | 1 | 0 | 0 |
| | | D4 | | 0 | 1 | 0 | 1 | 0 | 0 | 1 | 1 | 0 | 0 |
| | | D3 | | 1 | 1 | 0 | 1 | 1 | 1 | 0 | 1 | 0 | 1 |
| | | D2 | | 1 | 1 | 0 | 1 | 1 | 1 | 0 | 1 | 0 | 1 |
| | | D1 | | 1 | 1 | 0 | 1 | 1 | 1 | 0 | 0 | 0 | 1 |
| | | D0 | | 1 | 1 | 0 | 1 | 1 | 1 | 0 | 0 | 0 | 1 |
| | Data Mask | | | N | N | N | Y | Y | N | N | N | N | Y |
| B | Transmitted data | D7 | 0 | 0 | 1 | 1 | 0 | 1 | 0 | 0 | 0 | 0 | 1 |
| | | D6 | 0 | 0 | 1 | 1 | 1 | 1 | 0 | 0 | 0 | 0 | 0 |
| | | D5 | 0 | 0 | 1 | 1 | 0 | 1 | 0 | 0 | 1 | 0 | 1 |
| | | D4 | 0 | 0 | 1 | 1 | 1 | 1 | 0 | 0 | 1 | 0 | 0 |
| | | D3 | 0 | 1 | 1 | 1 | 0 | 1 | 1 | 1 | 1 | 0 | 1 |
| | | D2 | 0 | 1 | 1 | 1 | 1 | 1 | 1 | 1 | 1 | 0 | 0 |
| | | D1 | 0 | 1 | 1 | 1 | 0 | 1 | 1 | 1 | 0 | 0 | 1 |
| | | D0 | 0 | 1 | 1 | 1 | 1 | 1 | 1 | 1 | 0 | 0 | 0 |
| | | DBM | 0 | 0 | 0 | 1 | 1 | 1 | 0 | 1 | 0 | 0 | 1 |
| C | DQ state change T(n-1) to T(n) | D7 | | 0 | 1 | 0 | 1 | 1 | 1 | 0 | 0 | 0 | 1 |
| | | D6 | | 0 | 1 | 0 | 0 | 0 | 1 | 0 | 0 | 0 | 0 |
| | | D5 | | 0 | 1 | 0 | 1 | 1 | 1 | 0 | 1 | 1 | 1 |
| | | D4 | | 0 | 1 | 0 | 0 | 0 | 1 | 0 | 1 | 1 | 0 |
| | | D3 | | 1 | 0 | 0 | 1 | 1 | 0 | 0 | 0 | 1 | 1 |
| | | D2 | | 1 | 0 | 0 | 0 | 0 | 0 | 0 | 0 | 1 | 0 |
| | | D1 | | 1 | 0 | 0 | 1 | 1 | 0 | 0 | 1 | 0 | 1 |
| | | D0 | | 1 | 0 | 0 | 0 | 0 | 0 | 0 | 1 | 0 | 0 |
| D | Type 1 DM pattern match | | | | N | Y | Y | | N | | | | Y |
| E | DQ change count | | | | 0 | 4 | 4 | | 0 | | | | 4 |
| | DBM | | | | 1 | 1 | 1 | | 1 | | | | 1 |
| | Sum | | | | 1 | 5 | 5 | | 1 | | | | 5 |
| | Type 2 DM pattern match | | | | N | Y | Y | | N | | | | Y |
| F | Write data | D7 | | 0 | 1 | 0 | | | 0 | 1 | 0 | 0 | |
| | | D6 | | 0 | 1 | 0 | | | 0 | 1 | 0 | 0 | |
| | | D5 | | 0 | 1 | 0 | | | 0 | 1 | 1 | 0 | |
| | | D4 | | 0 | 1 | 0 | | | 0 | 1 | 1 | 0 | |
| | | D3 | | 1 | 1 | 0 | | | 1 | 0 | 1 | 0 | |
| | | D2 | | 1 | 1 | 0 | | | 1 | 0 | 1 | 0 | |
| | | D1 | | 1 | 1 | 0 | | | 1 | 0 | 0 | 0 | |
| | | D0 | | 1 | 1 | 0 | | | 1 | 0 | 0 | 0 | |

Fig. 20

DATA MASK ENCODING IN DATA BIT INVERSION SCHEME

This application is a continuation of U.S. patent application Ser. No. 13/223,922, filed Sep. 1, 2011, the contents of which are incorporated herein in their entirety by reference.

FIELD OF THE INVENTION

This disclosure generally relates to techniques and circuits for a memory circuit, and more particularly to techniques and circuits for data mask encoding and data bit inversion.

BACKGROUND

A data interface for a memory circuit, such as a dynamic random access memory (DRAM), includes multiple signals. These signals can be transmitted via physical wires and input/output (I/O) circuits. Relative to other components, I/O circuits can be large in size and require chip size/die area. As a result, it can be advantageous to minimize the number of I/O circuits. In many memory standards the data interface includes the actual data bus (DQ), the data mask information (DM), and the data bit inversion information (DBI).

The data mask function can allow a data byte/word to be blocked from being written to a memory array. This operation can be useful to avoid time-expensive operations, such as READ-MODIFY-WRITE operations. Most DRAM standards (e.g., DDR 1 . . . 3 and GDDR4) require a dedicated pin DM per byte for the data mask function. In operation, the DRAM latches the data from the bus and the data mask, and later ignores the latched data information when determined that the mask bit is provided.

The data bit inversion function can be used to reduce the maximum power consumption involved in the transfer of data to the memory array. Similar to the data mask function, a dedicated pin DBI per byte is generally used for the DBI function. Different data bit inversion schemes can be used depending on whether the interface is terminated or unterminated.

In terminated interfaces, such as GDDR5, the Data Bit Inversion-Direct Current scheme (DBI-DC) may be used. Since current is flowing with a logical "0" rather than with a logical "1" DBI-DC minimizes the number of "0"s in a given data word. Thus, for example, if the number of logical "0" in a data word is five or more, the data its of the data word will be inverted and the DBI signal is asserted to indicate that the data has been inverted. In this manner, DBI-DC is able to reduce power consumption.

In unterminated interfaces, the Data Bit Inversion-Alternate Current scheme (DBI-AC) can be used. DBI-AC minimizes the number of toggling data lines. With DBI-AC encoding, the DBI pin signals to invert the data if more than half of the transferred data in a data word changed from one cycle to the next cycle. This DBI-AC encoding can reduce the average power consumption as well as the maximum peak currents, since less data lines need to be charged and discharged. In addition, this can limit the supply noise resulting from the inherent inductance of the DRAM and GPU package as well as from the dI/dt (current change over time).

FIG. 1 illustrates an exemplary implementation of a data write system supporting the data mask function and the data bit inversion function. The system can include a memory controller and a DRAM memory. The memory controller can pass a data word comprising 8 bits into a DBI encoder. The DBI encoder can determine whether the data word should be inverted. If inversion is appropriate, the DBI encoder can invert the data word and assert a DBI signal. The data word (in inverted form or not) can then be passed to the DRAM memory via data bus DQ and the DBI signal can be passed via the data line DBI. A separate DM signal can, be passes by the memory controller to the DRAM memory via data line DM.

The DBI decoder in DRAM memory can receive the data word and DBI signal. The decoder can invert the data word again depending on the DBI signal. The data word can then be written to the memory core. However, if the DM signal is asserted, the data word can be masked so that it is not written to the memory core.

FIGS. 2a and 2b are flow charts of exemplary processes for implementing the DBI-DC scheme and the DBI-AC scheme, respectively.

For DBI-DC as shown in FIG. 2a, logical output data, such as a data word, is passed into an encoder in the memory controller. The number of "0"s in the logical output data is determined. In this case, since the logical output data constitutes a data word, which is equal to a byte (or 8 bits) of data, it is determined whether there are more than four "0"s in the data word. If there are more than four "0"s, the data is inverted and the /DBI signal is driven low. Note that in this case the /DBI signal is an active low signal (i.e., a logical "1" is represented by a low voltage rather than by a high voltage). On the other hand, if there are four or less "0"s, the data is not inverted and the /DBI signal is driven high.

When the data word and the /DBI signal are received by the DRAM memory, it is determined whether the data word has been inverted by looking at the /DBI signal. If the /DBI signal is a logical "0", it is determined that the data word was inverted and so the data word is inverted again. If the /DBI signal is a logical "1", it is determined that the data word was not inverted and so the data word is left alone. The data word (whether inverted or not) is then written to the DRAM memory.

For DBI-AC as shown in FIG. 2b, logical output data, such as a data word, is passed into an encoder in the memory controller. The number of signal transitions on data lines for the current data word (current cycle) with respect to the previously transmitted data word (previous cycle) is determined. In this case, since the logical output data constitutes a data word, which is equal to a byte (or 8 bits) of data, it is determined whether there are more than four changing data line signals from the previous cycle to the current cycle. If there are more than four transitions, the data is inverted and the DBI signal is driven high. If there are four or less transitions, the data is not inverted and the DBI signal is driven low.

When the data word and the DBI signal are received by the DRAM memory, it is determined whether the data word has been inverted by looking at the DBI signal. If the DBI signal is a logical "1", it is determined that the data word was inverted and so the data word is inverted again. If the DBI signal is a logical "0", it is determined that the data word was not inverted and so the data word is left alone. The data word (whether inverted or hot) is then written to the DRAM memory.

FIGS. 3 and 4 illustrate exemplary circuit components for implementing the DBI encoder according to the DBI-DC scheme and the DBI-AC scheme, respectively.

In FIG. 3, the data word is fed into a counter and an XOR gate. When determined that the data word includes more than four "0"s, the counter outputs a logical "1" which is fed into the XOR gate and a NOT gate. This results in the bits of the data word being inverted by the XOR gate and the /DBI signal being asserted (according to the active low paradigm). When determined that the data word includes our or less "0"s, the counter outputs a logical "0" which is fed into the XOR gate and the NOT gate. This results in the bits of the data word staying the same and the /DBI signal not being asserted.

In FIG. 4, the data word is fed into a counter and an XOR gate. Also fed into the counter is the data word transmitted in the previous cycle (thus, the data word in its inverted state if it was inverted, or in its non-inverted state if it was not inverted). When determined that there are more than four transitions, the counter outputs a logical "1" which is fed into the XOR gate and is output as the DBI signal. This results in the bits of the data word being inverted by the XOR gate and the DBI signal being asserted (according to the active high paradigm). When determined that there are four or less transitions, the counter outputs a logical "0" which is fed into the XOR gate and is output as the DBI signal. This results in the bits of the data word staying the same and the DBI signal not being asserted.

FIGS. 5a and 5b illustrate exemplary circuit components for implementing the DBI decoder according to the DBI-DC scheme and the DBI-AC scheme, respectively.

In FIG. 5a, the transmitted data word is received and fed into an XOR gate. The /DBI signal is received and fed into a NOT gate, the output of which is then also fed into the XOR gate. The XOR gate appropriately inverts or doesn't invert the data word, which is then written to the memory core. The circuit according to FIG. 5b operates in a similar fashion except that a NOT gate is not required since the DBI signal follows the active high paradigm.

In short, the above described systems require 10 data lines/pins per byte of data to accommodate both a data bit inversion function and a data mask function (i.e., eight lines/pins for the data word, one line/pin for the DBI signal, and one line/pin for the DM signal). This represents a 25% line/pin overhead relative to the amount of data being transferred.

SUMMARY

According to an embodiment, a system can include a controller comprising an encoder, a memory comprising a decoder, the encoder configured to receive multiple data bits and a data mask bit and output to the memory encoded data bits and an additional bit, the decoder configured to receive the encoded data bits and the additional bit and determine whether to invert the encoded data bits and whether to mask the encoded data bits.

The encoder can be configured to encode into the encoded data bits and the additional bit inversion information instructing to invert the encoded data bits and mask information instructing to mask the encoded data bits. The decoder can be configured to determine whether to invert the encoded data bits and whether to mask the encoded data bits based only on the encoded data bits and the additional bit.

The decoder can be configured to determine whether to mask the encoded data bits based on whether the encoded data bits and the additional bit comply with a DBI-DC scheme. The decoder can be configured to determine whether to mask the encoded data bits based on whether the encoded data bits and the additional bit comply with a DBI-AC scheme. The decoder can be configured to determine whether to mask the encoded data bits based only on the encoded data bits.

The decoder can be configured to determine whether to mask the encoded data bits based on whether the encoded data bits comply with a DBI-DC scheme. The decoder can be configured to determine whether to, mask the encoded data bits based on whether the encoded data bits comply with a DBI-AC scheme.

According to an embodiment, a method can include receiving multiple data bits and a data mask instruction. The method can further include outputting encoded data bits and an additional bit which together instructs to mask the encoded data bits when the data mask instruction indicates to mask the multiple data bits. The method can additionally include determining whether to invert the multiple data bits and outputting the multiple data bits in inverted or non-inverted form and the additional bit, when the data mask instruction indicates not to mask the multiple data bits. The additional bit in this case can indicate whether the outputted multiple data bits have been inverted.

The method can include receiving the encoded data bits and the additional bit, determining whether the encoded data bits and additional bit comply with a DBI-DC scheme, and masking the encoded data bits when determined that the encoded data bits and additional bit do not comply with the DBI-DC scheme.

The method can include receiving the encoded data bits and the additional determining whether the encoded data bits and additional bit comply with a DBI-AC scheme, and masking the encoded data bits when determined that the encoded data bits and additional bit do not comply with the DBI-AC scheme.

The method can include receiving the encoded data bits and the additional bit, determining whether the encoded data bits comply with a DBI-DC scheme, and masking the encoded data bits when determined that the encoded data bits do not comply with the DBI-DC scheme.

The method can include receiving the encoded data bits and the additional bit, determining whether the encoded data bits comply with a DBI-AC scheme, and masking the encoded data bits when determined that the encoded data bits do not comply with the DBI-AC scheme.

The method can include receiving the multiple data bits in inverted or non inverted form and the additional bit, determining whether to invert the multiple data bits based on the additional bit, inverting the multiple data bits if determined to invert the multiple data bits, and writing the multiple data bits to memory.

BRIEF DESCRIPTION OF THE DRAWINGS

FIG. 13 depicts a sample encoding for a 4-bit data word when using the DBI-DC scheme.

FIG. 20 depicts a table providing an example of several data transfers using the DBI-AC scheme according to an embodiment.

DETAILED DESCRIPTION

The claimed subject matter will now be described herein with reference to illustrative embodiments. Those skilled in the art will recognize that many alternative embodiments can be accomplished using the teachings of this disclosure and that the claimed subject matter is not limited to these embodiments, which are illustrated here for explanatory purposes.

Overview

Described are methods and circuits for data mask and data bit inversion encoding and decoding for a memory circuit. According to these methods and circuits, the number of data lines/pins required to encode data mask information and data bit inversion information can be reduced. In particular, in an embodiment the data mask and data inversion functions for a portion of data such as a data word, can be merged onto a common pin/data line. In other embodiments, a data mask instruction can be conveyed through a transmitted data word itself without using any extra pins. In this case, the extra pin can be used only for transmitting an inversion instruction. According to these embodiments, the pin overhead can be reduced from two pins per word to one pin per word.

Figure 1:
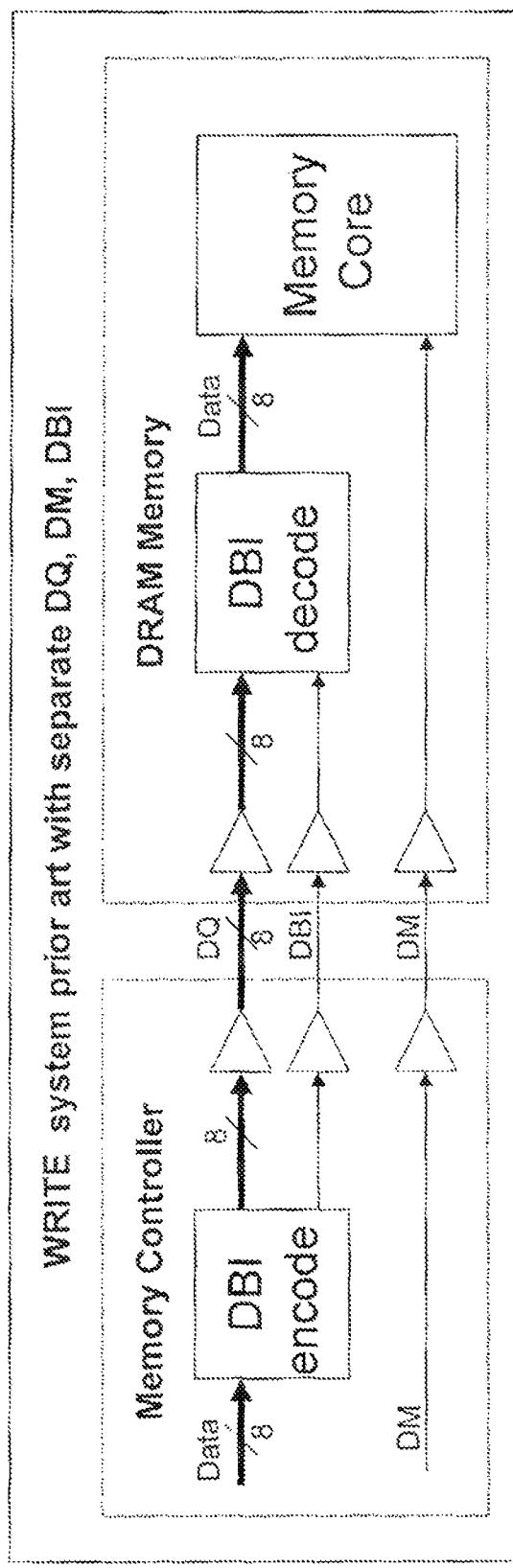
FIG. 1 illustrates an exemplary implementation of a data write system supporting a data mask function and a data bit inversion function.

In particular, according to an embodiment, data that should be written to memory can be transmitted in compliance with the DBI rules (DC or AC) such that the transmitted data is DBI compliant, whereas data that should not be written to memory (e.g., that should be masked) can be transmitted in noncompliance with the DBI rules such that the transmitted data is DBI noncompliant. This contrasts with the implementation depicted in FIG. 1, where the encoder properly encodes the data so that the DQ and DBI pins transfer the data in compliance with DBI rules irrespective of whether the data would be ultimately masked and not written to memory. Since data to be masked will not be written to memory, however, it is not necessary to properly encode the data and transfer it according to the DBI rules. Accordingly, noncompliant DBI states can be used to indicate that data masking should occur, thus eliminating the need for a separate DM pin/line.

More specifically, in a DBI-DC encoding of a data byte, the encoding would consist of eight DQ signals and one DBI signal. Thus, nine bits would be transferred which provides 512 different possible states (i.e., $2^9 512$). Of these 512 possible states, only 256 of them fulfill the DBI-DC coding rules. Accordingly, any of the 256 DBI noncompliant bit combinations may be used to indicate a data word that should be masked. Similarly, a DBI-AC encoding of a data word would provide 512 different states, only 256 of them being DBI-AC compliant.

There are at least two different techniques that may be used to indicate that data should be masked in accordance with the above. First, the system may be designed such that a single, fixed noncompliant state is used to indicate that a data word should be masked. Decode logic for interpreting transmitted data can be designed to detect the fixed noncompliant state and recognize it as a data mask instruction. This technique is described below as Type I DM code detection. Second, the system may be designed such that any of the noncompliant states may be used to indicate that a data word stolid be masked. In this case, decode logic for interpreting transmitted data can be designed to detect whether transmitted data corresponds to any of the noncompliant states and recognize such noncompliance as a data mask instruction. This technique is described below as Type II DM code detection.

For Type I DM code detection, choosing a single, fixed noncompliant state to represent a data mask instruction has the advantage of being easier and faster to detect. Circuit logic at the decoder can be easily designed to determine quickly whether the transferred data is identical to the pattern of the single, fixed noncompliant state. On the other hand, this technique has the disadvantage of being less robust. For example, if one or more bits are accidentally inverted during transfer, the pattern will no longer be identical to the single faxed noncompliant state. As a result, the data mask instruction would be lost and the transmitted data word would be incorrectly written to the memory core. Circuit logic for implementing Type I DM code detection in both DBI-DC and DBI-AC schemes will be described below with respect to particular embodiments.

For Type II DM code detection, permitting a data mask instruction to be represented by any of the noncompliant states has the advantage of being potentially more robust since even if a bit is accidentally changed during transfer, as long as the pattern remains noncompliant, it can be interpreted as a data mask instruction. For example, in the DBI-DC scheme, if a noncompliant state having six "0"s is selected to represent the data mask instruction, even if one of the "0"s accidentally changes to a "1" during transfer, the pattern will still be noncompliant since it will still consist of five "0"s. On the other hand, this technique can have the disadvantage of requiring more complicated logic to detect a mask instruction. This can be because the logic cannot merely match the transferred pattern to a single noncompliant pattern, but must potentially consider whether the transferred data is any of multiple noncompliant patterns. Additionally, the time required to detect the mask instruction can be longer than for Type I DM code detection. Circuit logic for implementing Type II DM code detection in both DBI-DC and DBI-AC schemes will be described below with respect to particular embodiments.

Figure 6:
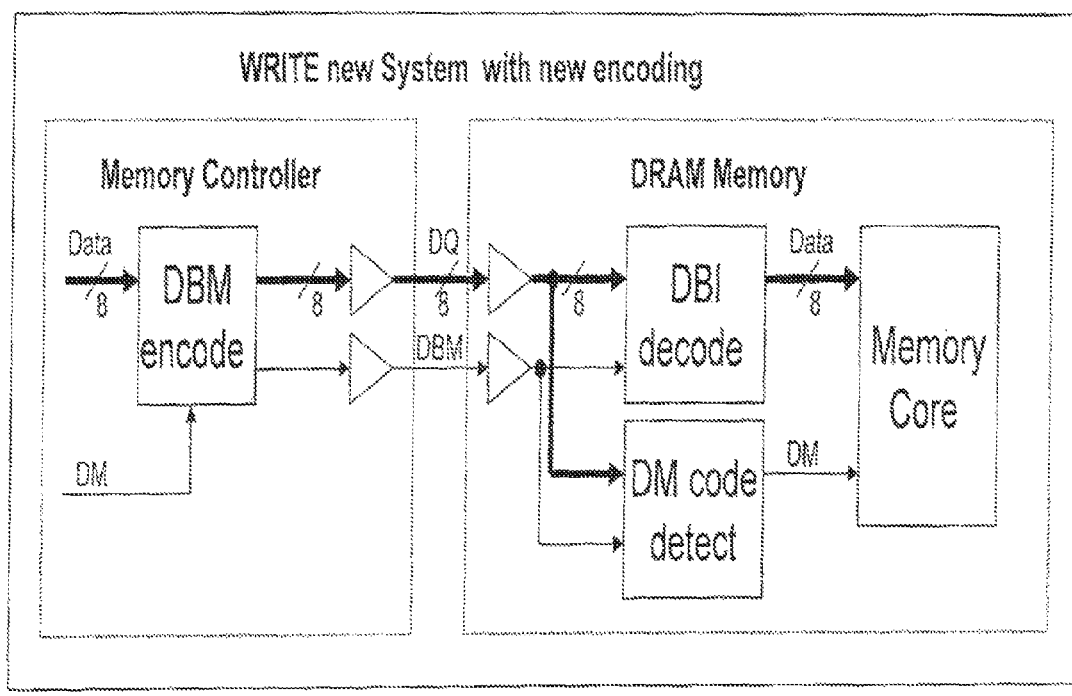
FIG. 6 illustrates an exemplary implementation of a data write system supporting the data mask function and the data bit inversion function according to an embodiment.

FIG. 6 illustrates an exemplary implementation of a data write system supporting the data mask function and the data bit inversion function according to an embodiment. The system can include a memory controller and a DRAM memory. The memory controller can pass a data word comprising 8 bits into a DBM encoder. The DBM encoder can also receive a DM signal indicating whether a given data word should be masked. According to either the DBI-DC or the DBI-AC scheme, the DBM encoder can encode both data inversion information and data mask information into the data word and a DBM signal, DBM is intended to signify that both data inversion information and data mask information can be conveyed using the signal.

The DBM encoder can determine whether the data word should be masked, and whether the data word should be inverted. If the data word should be masked (as indicated by the DM signal), the DBM encoder can encode the data word and DBM signal according to a DBI noncompliant state, as described above. On the other hand, if the data word should not be masked, the DBM encoder can determine whether inversion is required. If inversion is required according to the DBI scheme being used, the DBI encoder can invert the data word and indicate that inversion has occurred using the DBM signal, similar to FIG. 1 with the DBI signal. The data word can then be passed to the DRAM memory via data bus DQ and the DBM signal can be passed via the data line DBM.

The DBM decoder in DRAM memory can receive the data word and DBM signal. In particular, the data word and DBM signal can be passed to the DBI decode block and processed according to the DBI scheme being used. Thus, the DBI decode block can invert the data word if DBM is asserted and not invert the data word if the DBM signal is unasserted. The data (inverted or not) can then be output toward the memory core. At the same time, however, the DM code detect block can receive the data word and DBM signal to determine whether the data should be masked. The DM code detect block can do this by determining whether the data has been transferred in a DBI compliant state, as described above. If determined that the data was transferred in a DBI compliant state, the DM code detect block can output an unasserted DM signal, which can allow the data word output by the DBI decode block to be written to the memory core. If determined that the data was transferred in a DBI noncompliant state, the DM code detect block can output an asserted DM signal, which can cause the data word output by the DBI decode block to be masked and thus not written to the memory core.

Accordingly, the number of data lines/pins required to encode data mask information and data bit inversion information can be reduced. This can be applied to both the DBI-DC scheme and the DBI-AC scheme. More specific examples and embodiments are discussed below with respect to each of these schemes.

DBI-DC Scheme

Exemplary embodiments employing a DBI-DC scheme are described below. In particular, the encoding phase, the decoding phase, and a simplified example are described.

Encoding in an exemplary system using the DBI-DC scheme, a data bus between a controller and a memory can consist of a data word DQ that is Y bits wide and a flag /DBM (active low) that is one bit wide. As described above, the DBI-DC encoding scheme does not depend on the history of previous data. The total number of possible states for the Y bits and flag bit is $2^{(Y+1)}$. Of the $2^{(Y+1)}$ states, $2^Y$ are DBI-DC compliant and $2^Y$ are DBI-DC noncompliant. In the examples below. Y=8.

Figure 7:
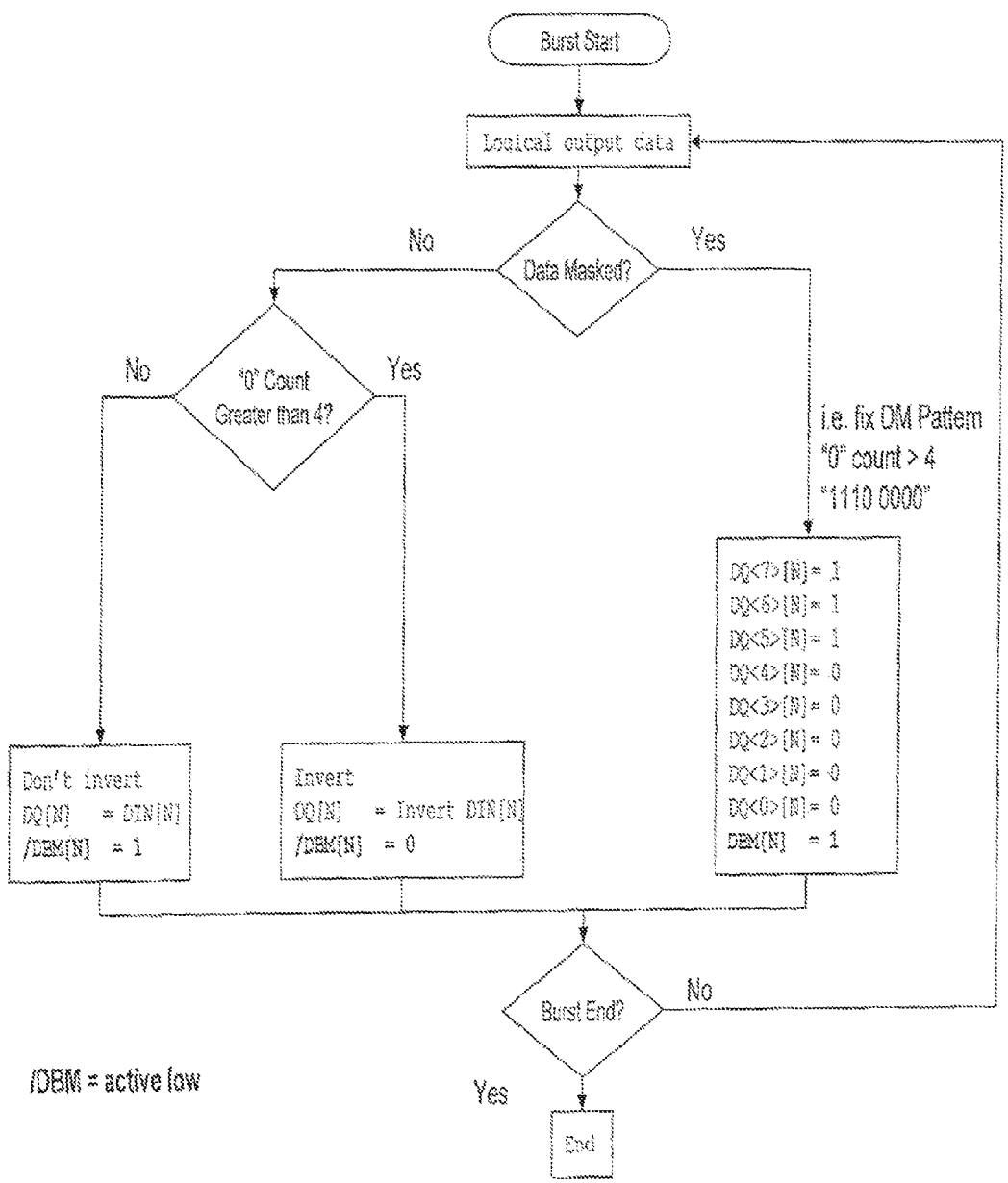
FIG. 7 illustrates a flow chart for an exemplary encode process in the DBI-DC scheme according to an embodiment.

FIG. 7 illustrates a flow chart for an exemplary encode process according to the DBI-DC scheme. Data burst represents the beginning of a burst of data that is to be transferred to memory. The data burst includes one or more cycles of logical output data at the controller that is to be transferred to memory over bus DQ. One cycle of logical output data corresponds to a data word, which comprises Y bits. It is determined whether the data word at the controller should be masked by looking at the DM signal.

If "Yes", the data word DQ (that is, the data word to be sent over the bus DQ) is set to a fixed pattern which is noncompliant with the DBI-DC scheme. In this example, the data word is set to 11100000. This can be done using a multiplexer, as described below with respect to FIG. 8. The pattern 11100000 is noncompliant by itself since there are five zeroes. In addition, however, the DBM signal is set to 1. For Type I DM code detection, this example uses DQ=11100000 and DBM=1 as the fixed pattern for indicating data mask instruction. For Type II DM code detection, it is only necessary that either the DQ pattern or the DQ+DBM pattern be noncompliant. Thus, since DQ is already noncompliant, it is not necessary for the DBM to be set to 1. However, setting DBM to 1 increases the robustness of the system since even if one of the 0s accidentally changes to a 1 during transmission, the DQ+DBM pattern will still be noncompliant. Thus, there is a benefit to choosing a DQ+DBM pattern that has a greater noncompliance.

If "No", the usual DBI-DC processing is performed to properly invert or not the data word. Thus, it is determined whether the number of 0s in the data word is greater than four. If "Yes", the data word, which is represented as DIN[N], where N indicates the current cycle, is inverted. In addition, the /DBM signal is set to 0. If "No", the data word DIN[N] is not inverted and the /DBM signal is set to 1. Then, DQ[N] and /DBM are transmitted to memory.

Then it is determined whether the data burst has ended (i.e., are there more cycles of logical output data?). If the data burst has not ended, the process repeats for the next cycle of data. Otherwise, the process ends.

Figure 2A:
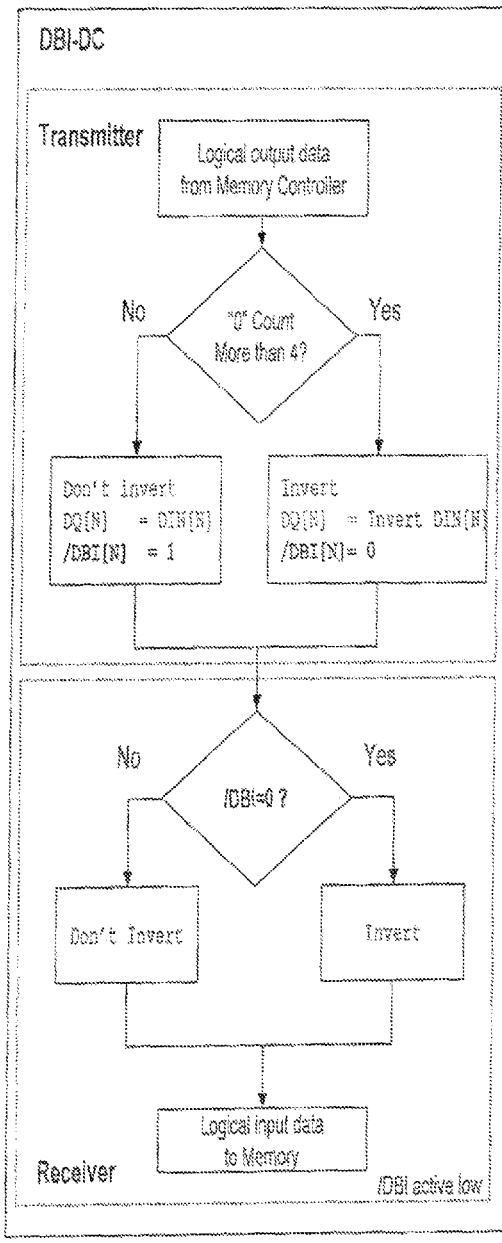
FIGS. 2a and 2b are flow charts of exemplary processes for implementing the DBI-DC scheme and the DBI-AC scheme, respectively.
Figure 2B:
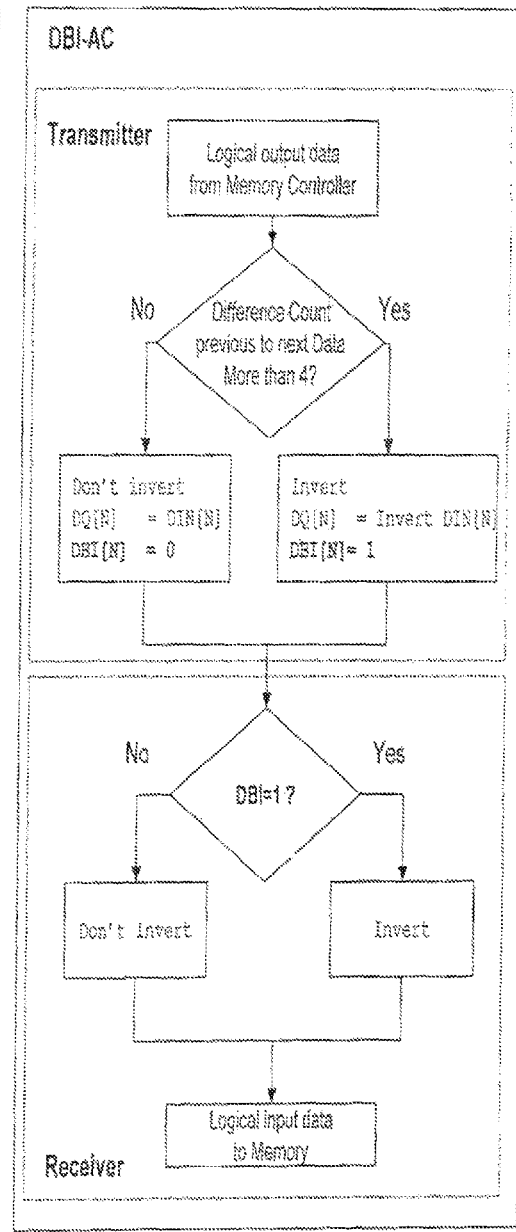
Figure 3:
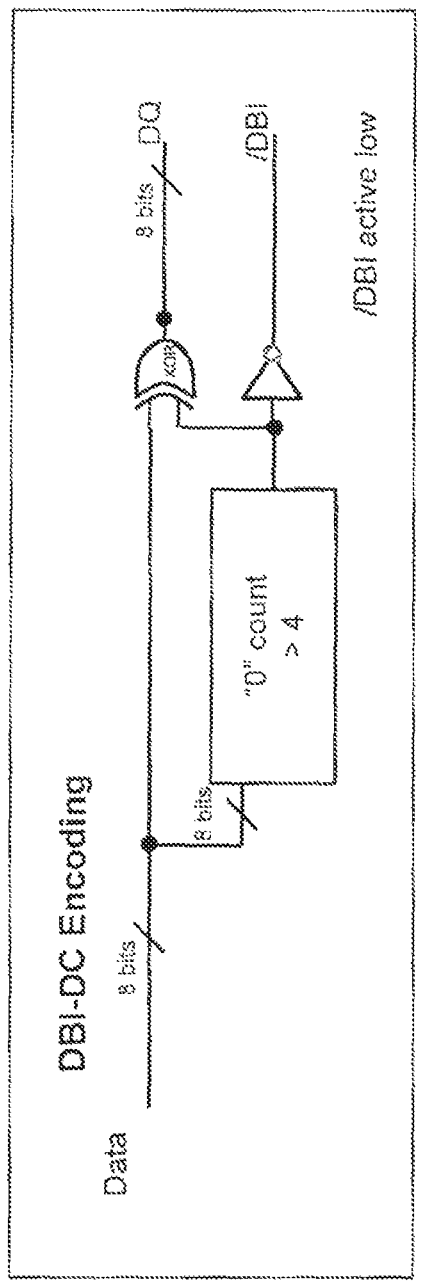
FIGS. 3 and 4 illustrate exemplary circuit components for implementing the DBI encoder according to the DBI-DC scheme and the DBI-AC scheme, respectively.
Figure 8:
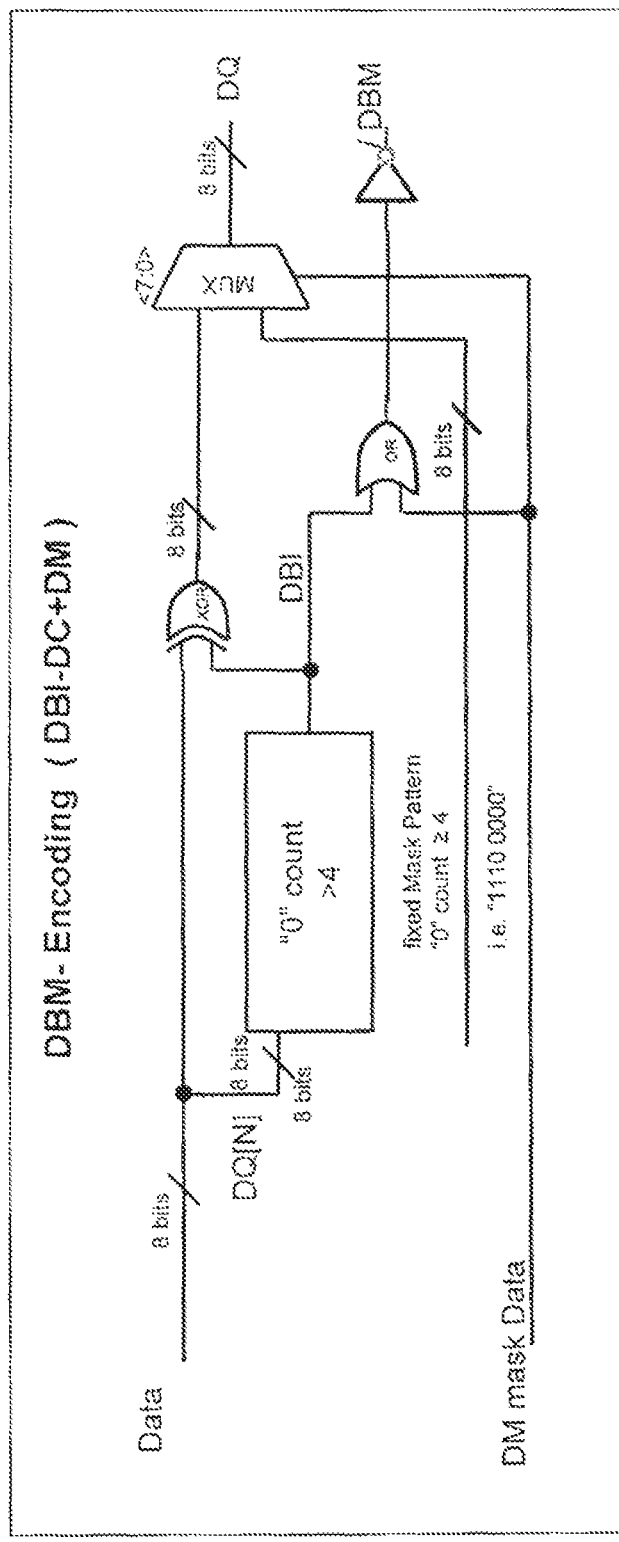
FIG. 8 shows an exemplary circuit, for implementing an encoder in the DBI-DC scheme according to an embodiment.

FIG. 8 shows an exemplary circuit diagram for implementing an encoder according to an embodiment. Similar to the circuit of FIG. 2, the circuit can include a counter for determining whether the data word needs to be inverted according to the DBI-DC scheme, an XOR gate for inverting the data word if necessary, and a NOT gate for setting the /DBM signal according to the active low paradigm. However, this circuit also includes a multiplexer MUX (2 to 1; 8 bit), an OR gate, and it uses the data mask signal DM. The MUX receives the DM signal and selects between normal DBI-DC data (that is appropriately inverted) and fixed DBI-DC noncompliant pattern for indicating a data mask instruction. In this example, consistent with FIG. 7, the fixed DBI-DC noncompliant pattern is 11100000. The OR gate receives the DBI signal output by the counter and the DM signal. The output of the OR gate is the inverted by the NOT gate to become the /DBM signal.

Decoding

Figures 5A, 5B:
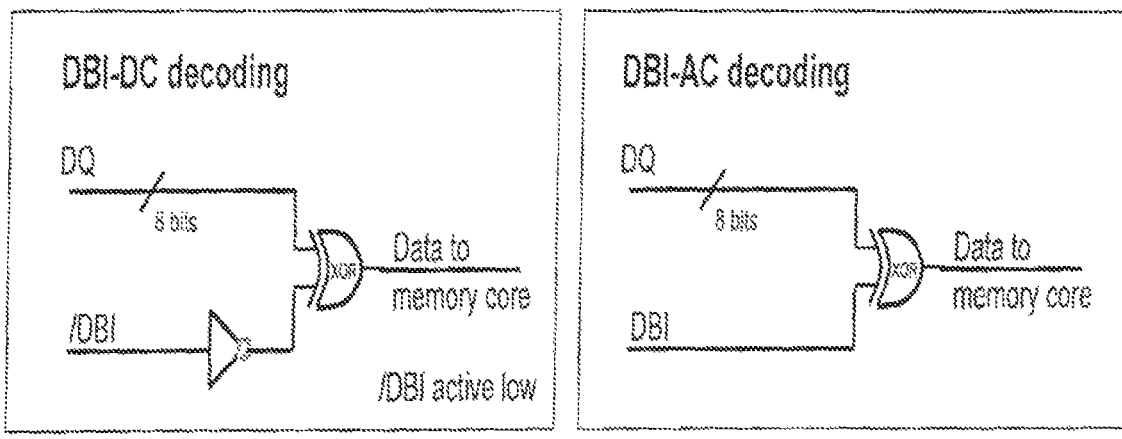
FIGS. 5a and 5b illustrate exemplary circuit components for implementing the DBI decoder according to the DBI-DC scheme and the DBI-AC scheme, respectively.
Figure 9:
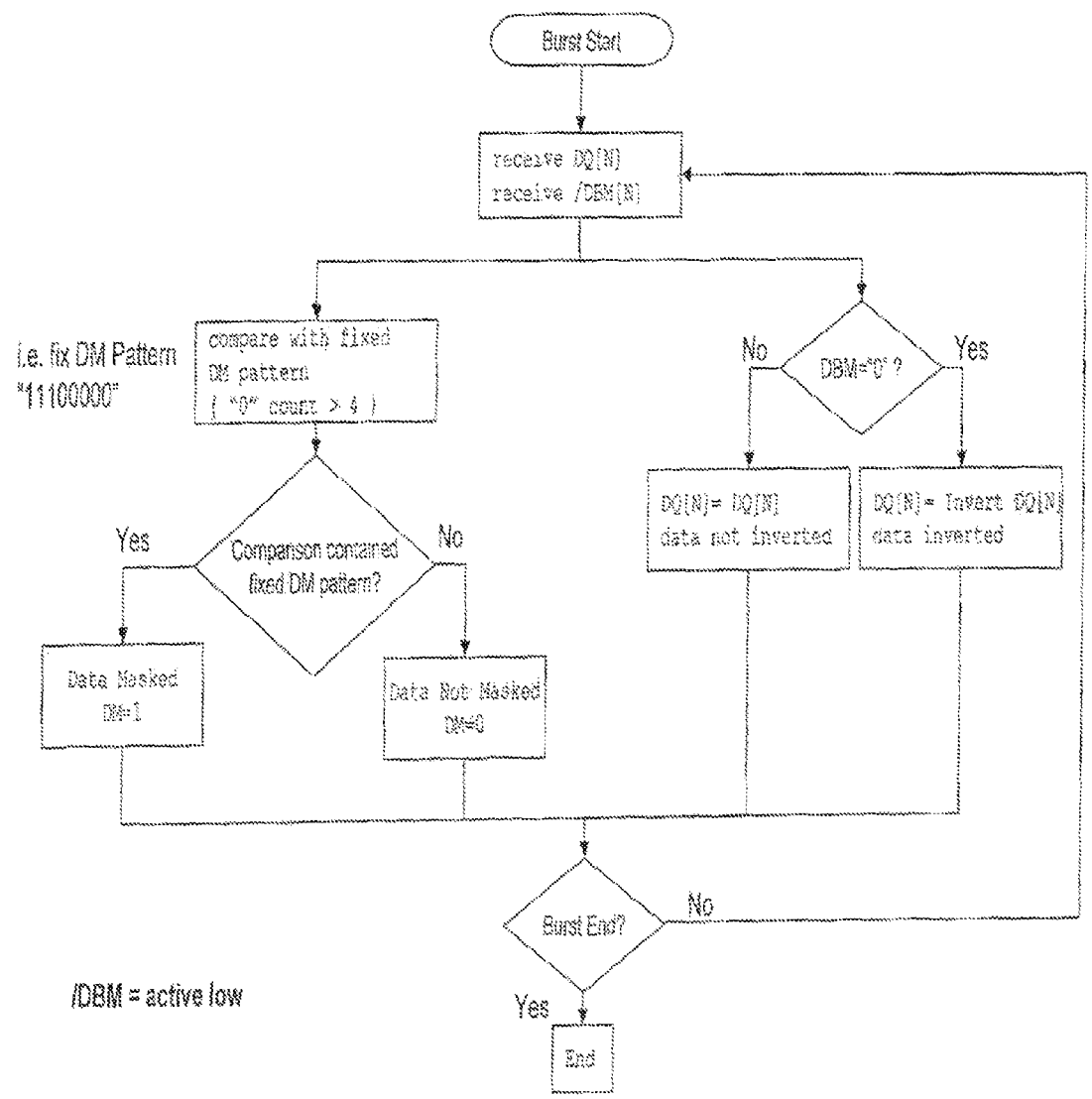
FIG. 9 depicts a flow chart illustrating the decode process for Type I decoding in the DBI-DC scheme according to an embodiment.
Figure 10:
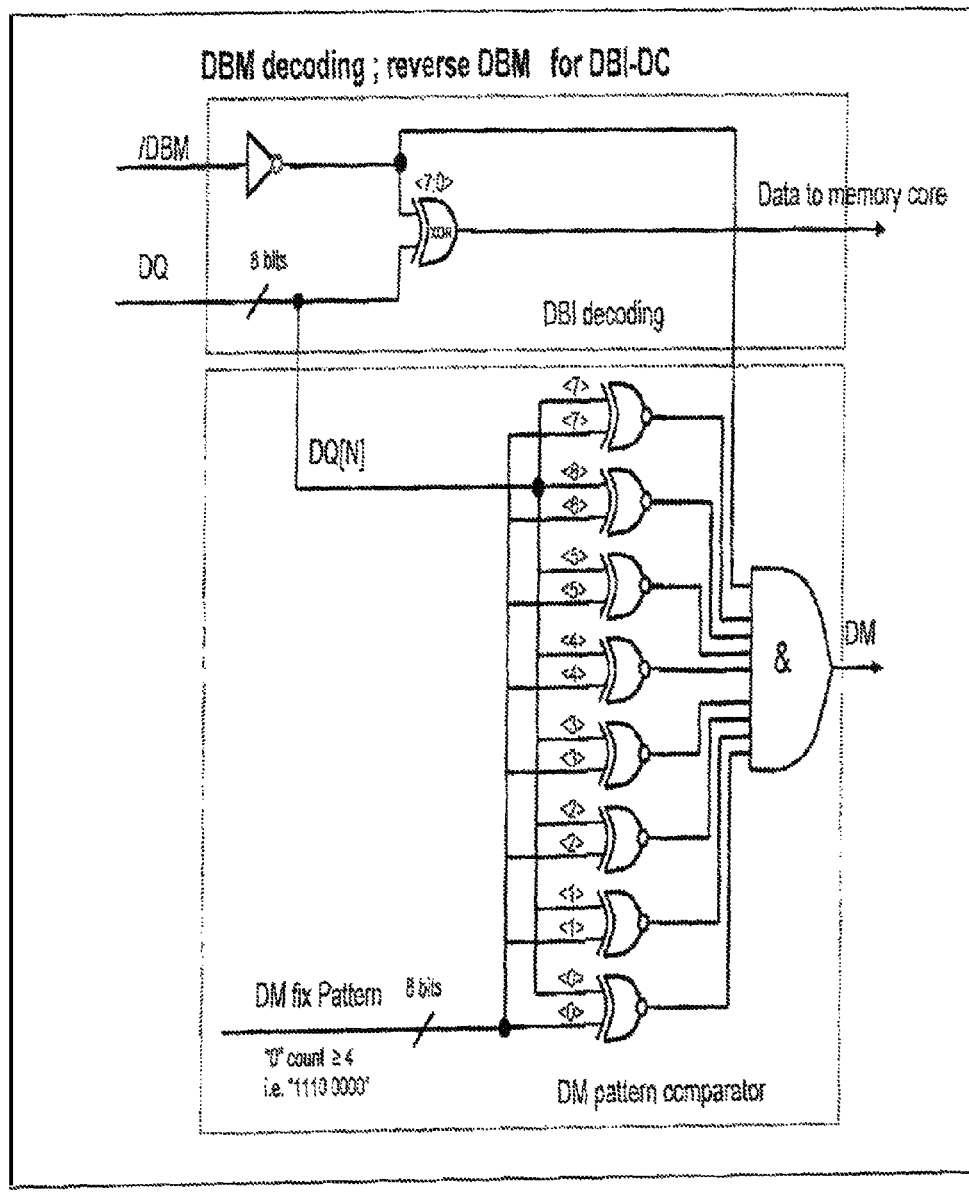
FIG. 10 depicts an exemplary circuit for implementing the DM detector for Type I decoding in the DBI-DC scheme according to an embodiment.

To decode the data word itself according to DBI-DC rules the circuit components depicted in FIG. 5a may still be used. A DM detector circuit can be added to facilitate detection of a data mask instruction. There are two options for decoding the masking information: Type I DM code detect and Type II DM code detect. Type I DM code detect can detect the masking information with exact DM-pattern match and Type II DM code detect can detect the masking information with a test for compliance with the DBI-DC encoding rules. FIGS. 9 and 10 illustrate Type I and FIGS. 11 and 12 illustrate Type II.

FIG. 9 depicts a flow chart illustrating the decode process for Type I. All DQ data bits, Y bit wide, are inverted according to the status of the /DBM. At the same time, mask information can be detected by comparing the incoming data word DQ with the fixed DM pattern 11100000 (which is DBI-DC noncompliant). If the compare matches and /DBM=0, this is interpreted as a data mask instruction and the DM signal is set to 1, which instructs that the data word should be masked. If the compare does not match and/or /DBMI=0, the DM signal is set to 0, which instructs that the data word should not be masked.

FIG. 10 depicts an exemplary circuit for implementing the DM detector according to Type I. The incoming DQ[N] data are bit wise compared to the predefined DM-pattern. If the compare to the DM-pattern is true and the inversion of /DBM is true, the DM signal is set to 1, which instructs that the data word should be masked. If any of the bit wise compares is not true or and/or the inversion of /DBM is not true, the DM signal is set to 0, which instructs that the data word should not be masked.

Figure 11:
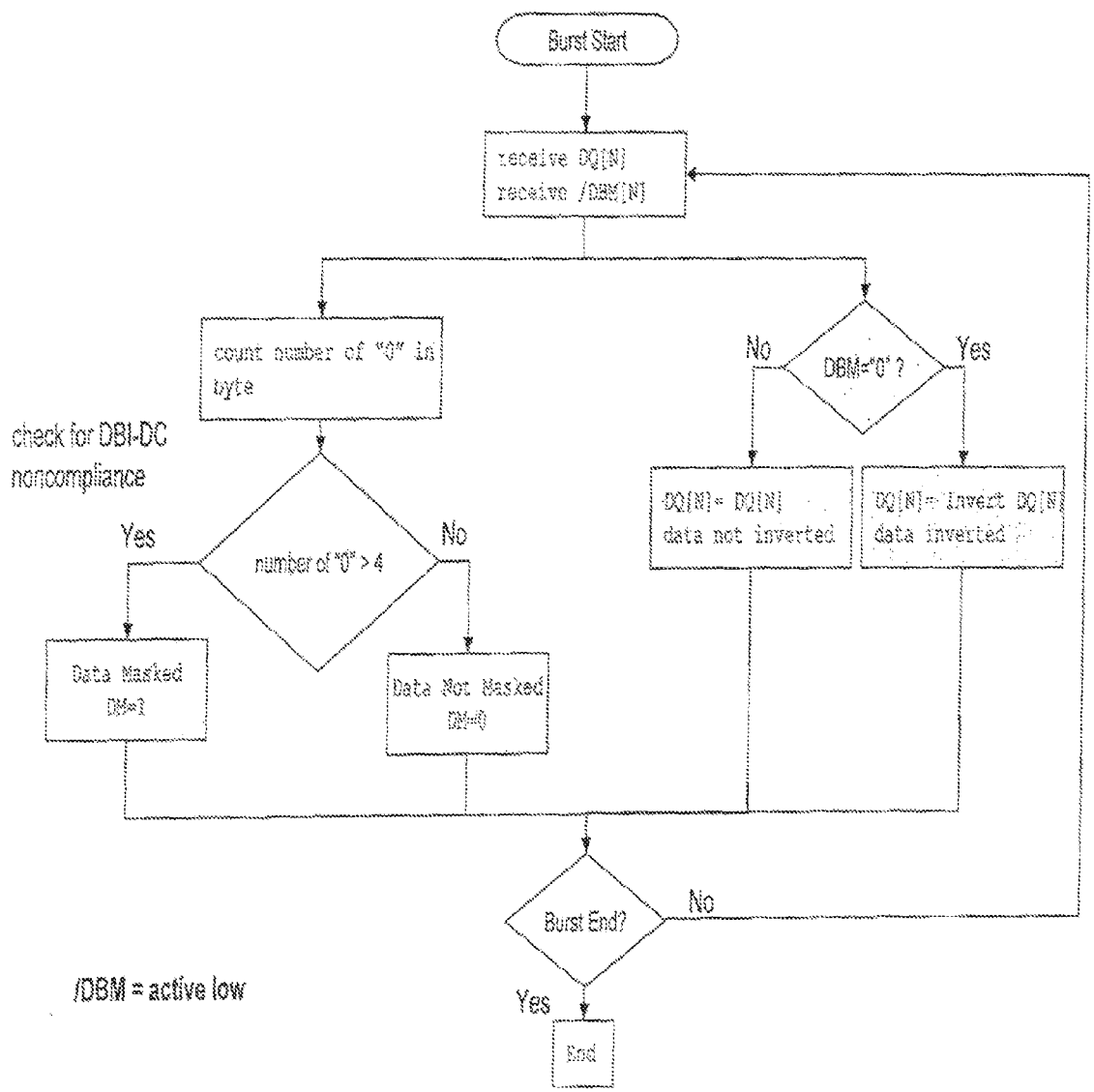
FIG. 11 depicts a flow chart illustrating the decode process for Type II decoding in the DBI-DC scheme according to en embodiment.
Figure 12:
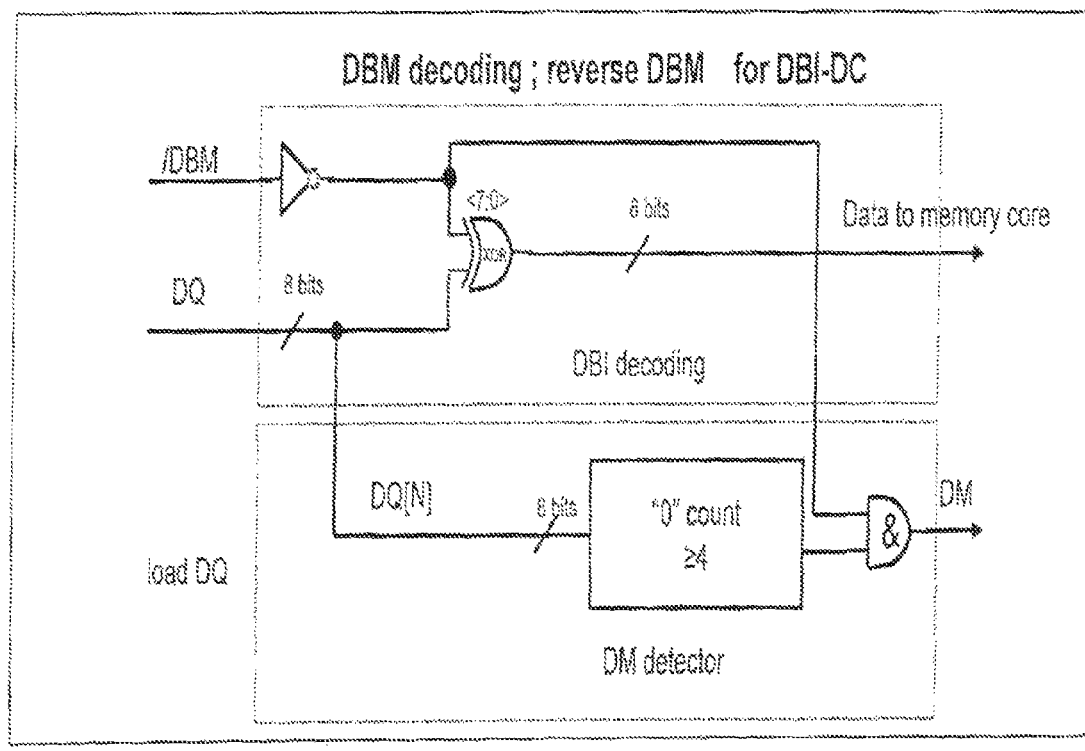
FIG. 12 depicts an exemplary circuit for implementing the DM detector according to Type II decoding in the DBI-DC scheme according to an embodiment.

FIG. 11 depicts a flow chart illustrating the decode process for Type II. All DQ data bits, Y bit wide, are inverted according to the status of the /DBM. At the same time, mask information can be detected by counting the number of 0s of the incoming data word DQ and the /DBM signal. This number can be compared to the DBI-DC compliance limit (Y/2). If the number of 0s is greater than the compliance limit, DM is set active, which instructs to mask the data word. If the number of 0s is equal to or less than the compliance limit. DM is set to 0, which instructs that the data word should not be masked.

FIG. 12 depicts an exemplary circuit for implementing the DM detector according to Type II. The number of 0s of the incoming DQ[N] data are counted. If the number of 0s is greater than or equal to 4 and the inverse of the /DBM signal is true, the AND gate outputs true and sets the DM signal to the memory core to 1, which instructs that the data should be masked. If the number of 0s is less than 4 and/or the inverse of the /DBM signal is not true, the AND gate outputs false and sets the DM signal to 0, which instructs that the data should not be masked. Note that this particular implementation requires that the /DBM signal be asserted. Alternatively, the inversion of the /DBM signal could be fed into the counter and the counter could determine whether the number of 0s in the data word DQ and the /DBM bit is greater than four. In this case, the AND pate could be removed. This can provide a more robust implementation since all that would be required is that the DQ+/DBM data encoding be noncompliant.

DBI-DC as previously described is an optimized encoding for high level terminated busses, where the number 0 should be minimized. The same approach is also valid for busses where the number of 1s needs to be minimized (e.g., ground level terminated or center level terminated). In this case, the polarity of DBM must be inverted (active high instead of active low). Also the DBI-DC limit rule changes to: invert if more than Y/2 bits are 1 (rather than 0).

EXAMPLE 1

Figure 13:
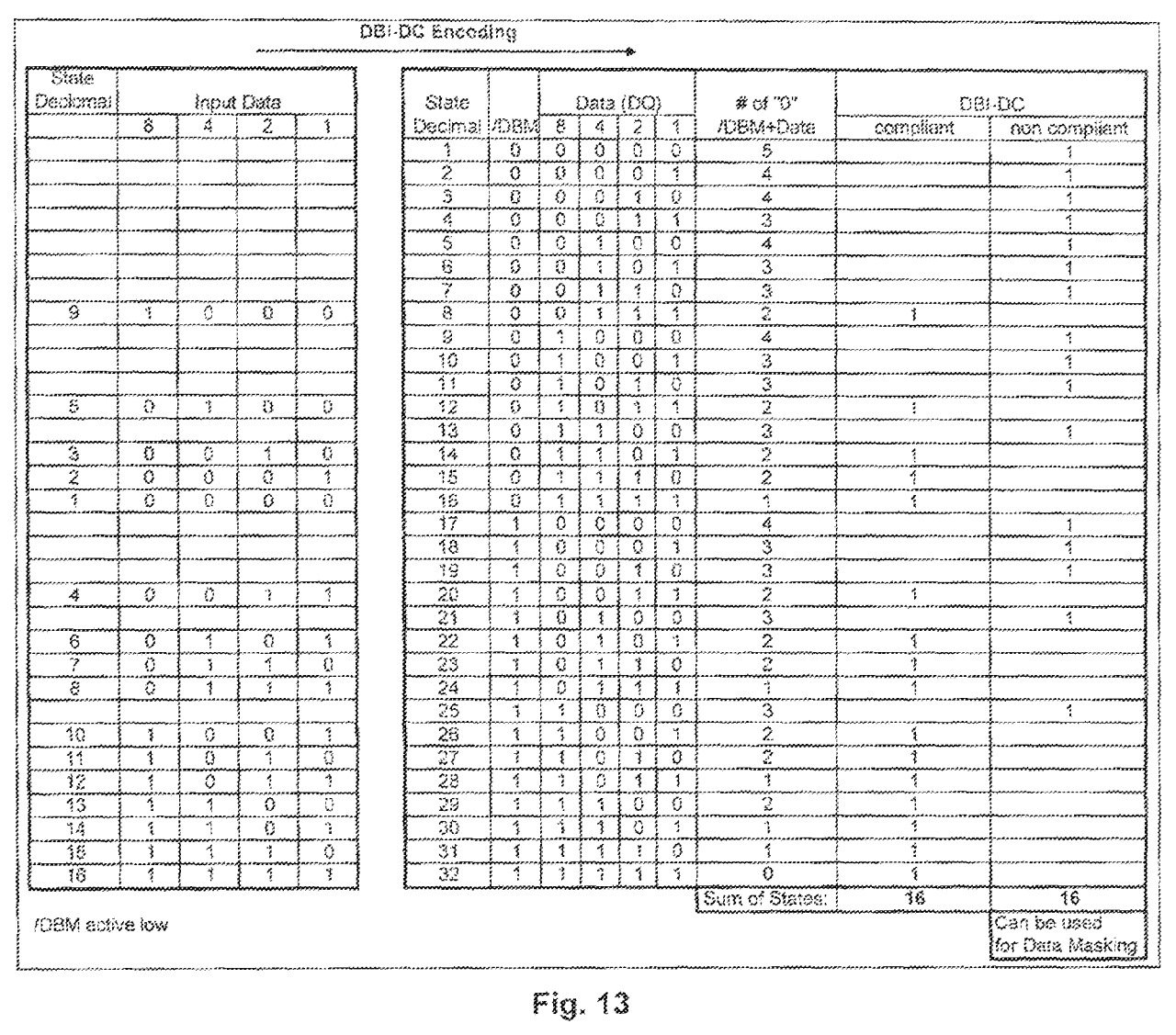

FIG. 13 depicts a sample encoding for a 4-bit data word (i.e., Y=4) when using the DBI-DC scheme. The left-hand table depicts the 16 bit combinations for the 4-bit word. The right-hand table depicts all of the possible states when the /DBM bit is included. The four bits in the data word and the one bit of the DBM allow for 32 possible states, only 16 of which are compliant under the DBI-DC scheme.

In particular, the right-hand table lists the 32 states, representing the various bit combinations for the /DBM and DQ bits. The number of 0s is indicated in the next column and the compliance or noncompliance with the DBI-DC rules is indicated in the last two columns. Any of the noncompliant states could be used to instruct data masking. Note that states 8, 12, and 14-16 in the right-hand table represent the inversion of states 9, 5, and 3-1, respectively, in the left-hand table.

DBI-AC Scheme

Exemplary embodiments employing a DBI-AC scheme are described below. In particular, the encoding phase, the decoding phase, and a simplified example are described.

Encoding

For the DBI-AC scheme, a date bus can consist of a data word Y bits wide and en inversion flag DBM 1 bit wide. The possible code space for the bus is $2^{(Y+1)}$. In contrast to DBI-DC encoding, DBI-AC encoding does depend on the history of previous data. In total $2^Y$ state transitions are possible. According to the DBI-AC encoding, only transitions from DQ[N−1] to DQ[N] with less than Y/2+1 bits changing are DBI-AC compliant. All other transitions can be used to encode a data mask instruction. In the examples below, Y=8.

Figure 14:
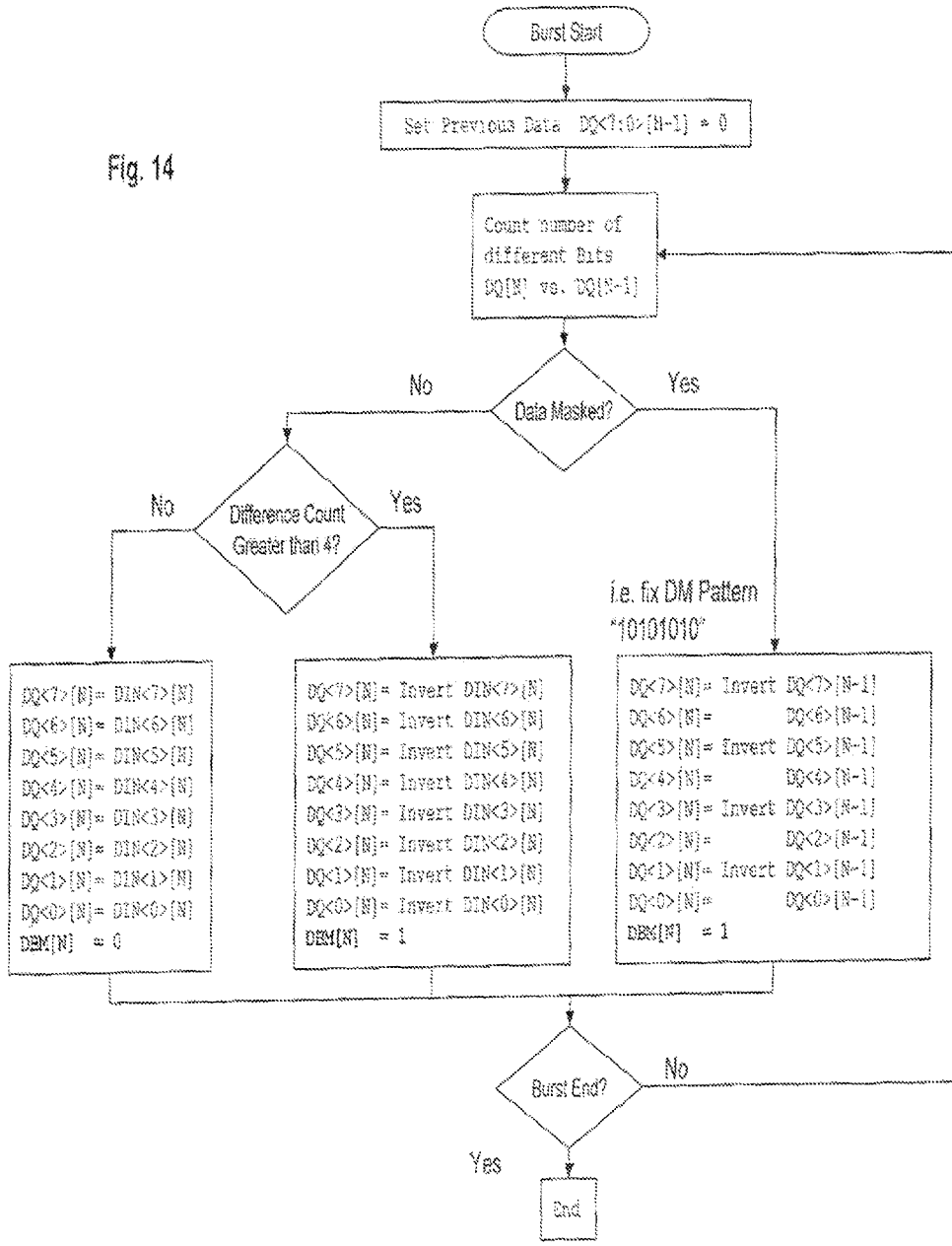
FIG. 14 illustrates an exemplary encode process in the DBI-AC scheme according to an embodiment.

FIG. 14 illustrates an exemplary encode process according to an embodiment. If the write data should be masked, the previous data on the bus DQ[N−1] is XOR'ed with a DM-pattern that contains more than Y/2 1s. The effect is that more than Y/2 bits are inverted, creating a DBI-AC noncompliant code word. This code word can be multiplexed onto the DQ-bus instead of the original data word.

Figure 4:
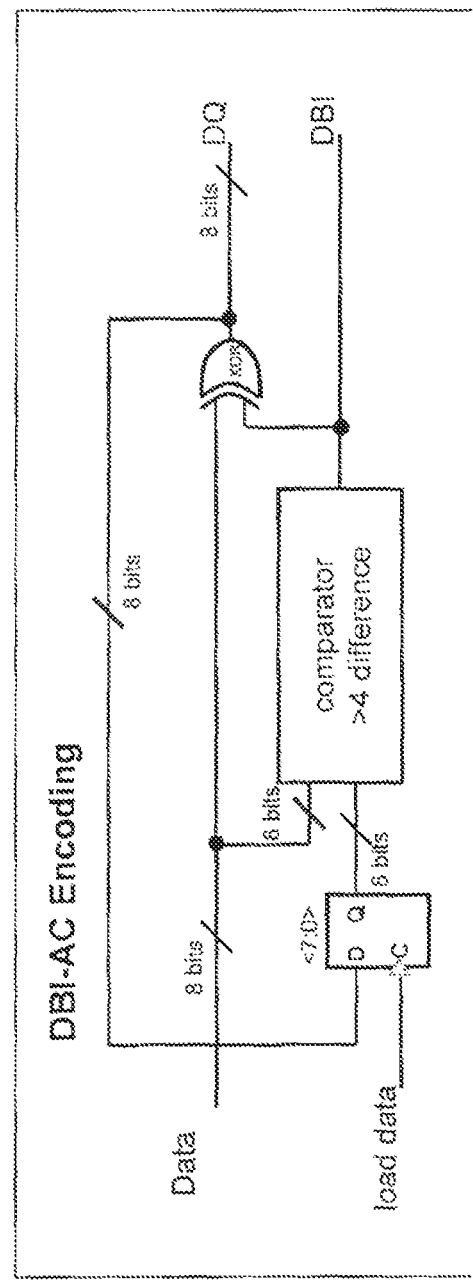
Figure 15:
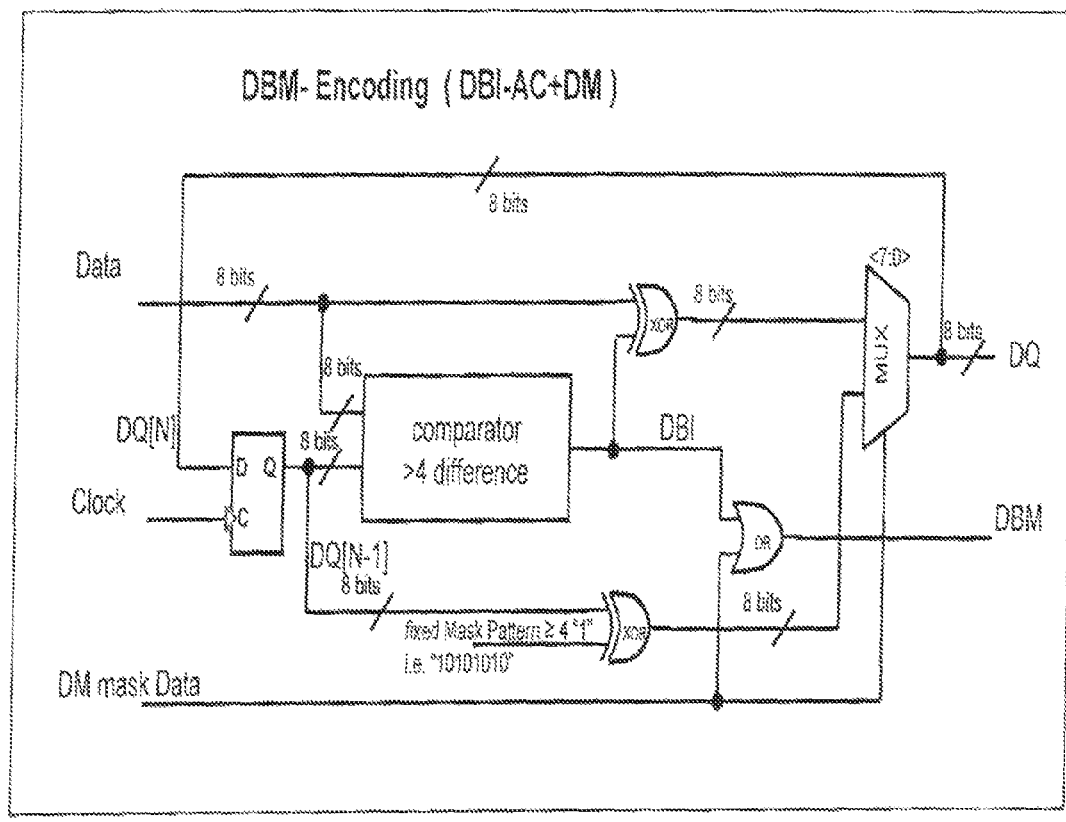
FIG. 15 illustrates an exemplary circuit for implementing the encode process in the DBI-AC scheme according to an embodiment.

FIG. 15 illustrates an exemplary circuit for implementing the encode process according to an embodiment. In an implementation for a one byte data word, the circuit depicted in FIG. 4 can be modified to include a multiplexer (2 to 1; 8 bit) which uses the DM signal to select between normal DBI data and the DM special data pattern. The DM special data pattern is generated with an XOR (8 bit) out of the previous DQ[N−1] data and the fixed 8-bit pattern that contains at least four 1s. In the generated DM special data pattern at least four bits changed in respect to DQ[N−1]. The DBM signal itself is a logical OR of DBI and DM.

Decoding

Figure 16:
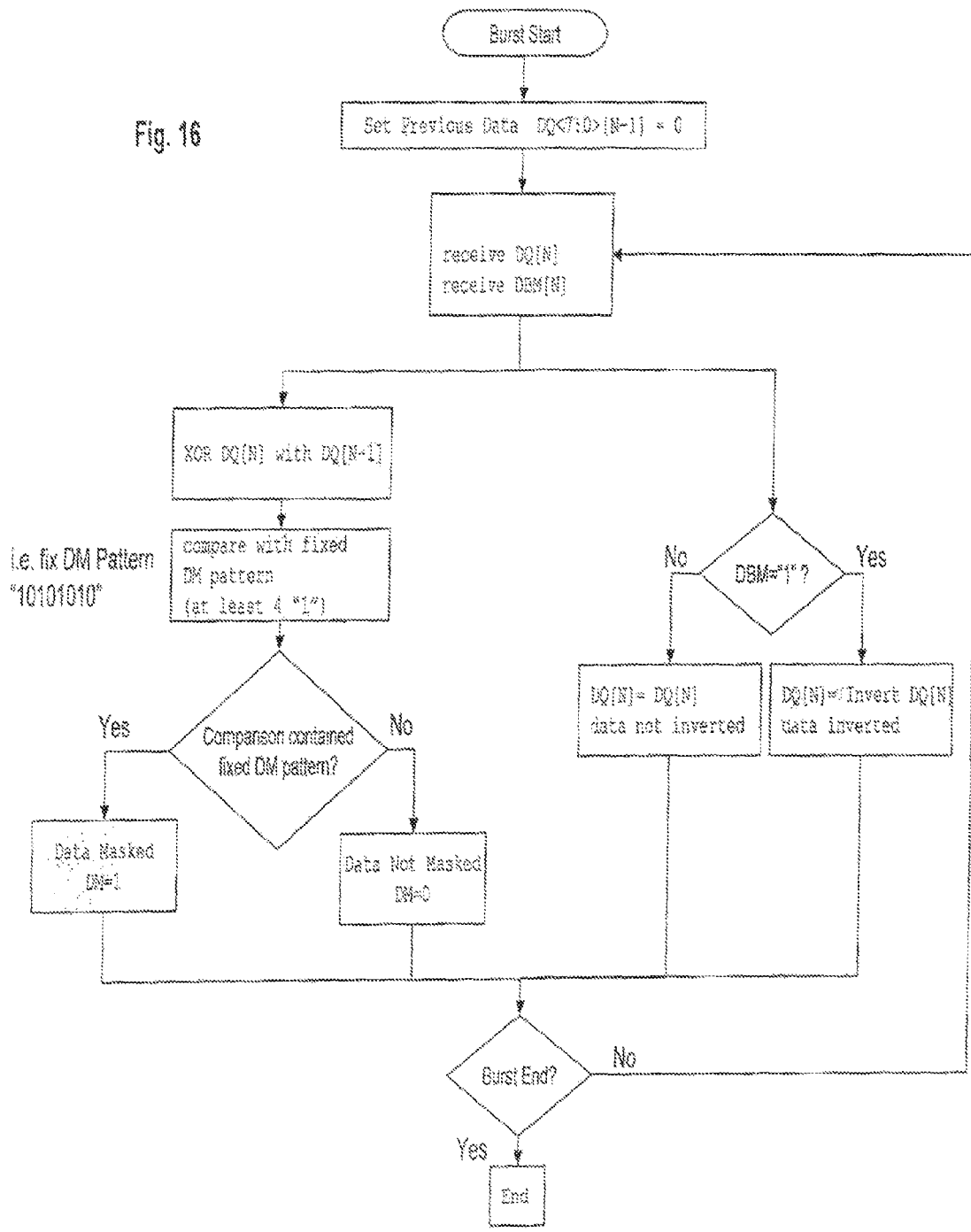
FIG. 16 depicts a flow chart illustrating the decode process for Type I decoding in the DBI-AC scheme according to an embodiment.
Figure 17:
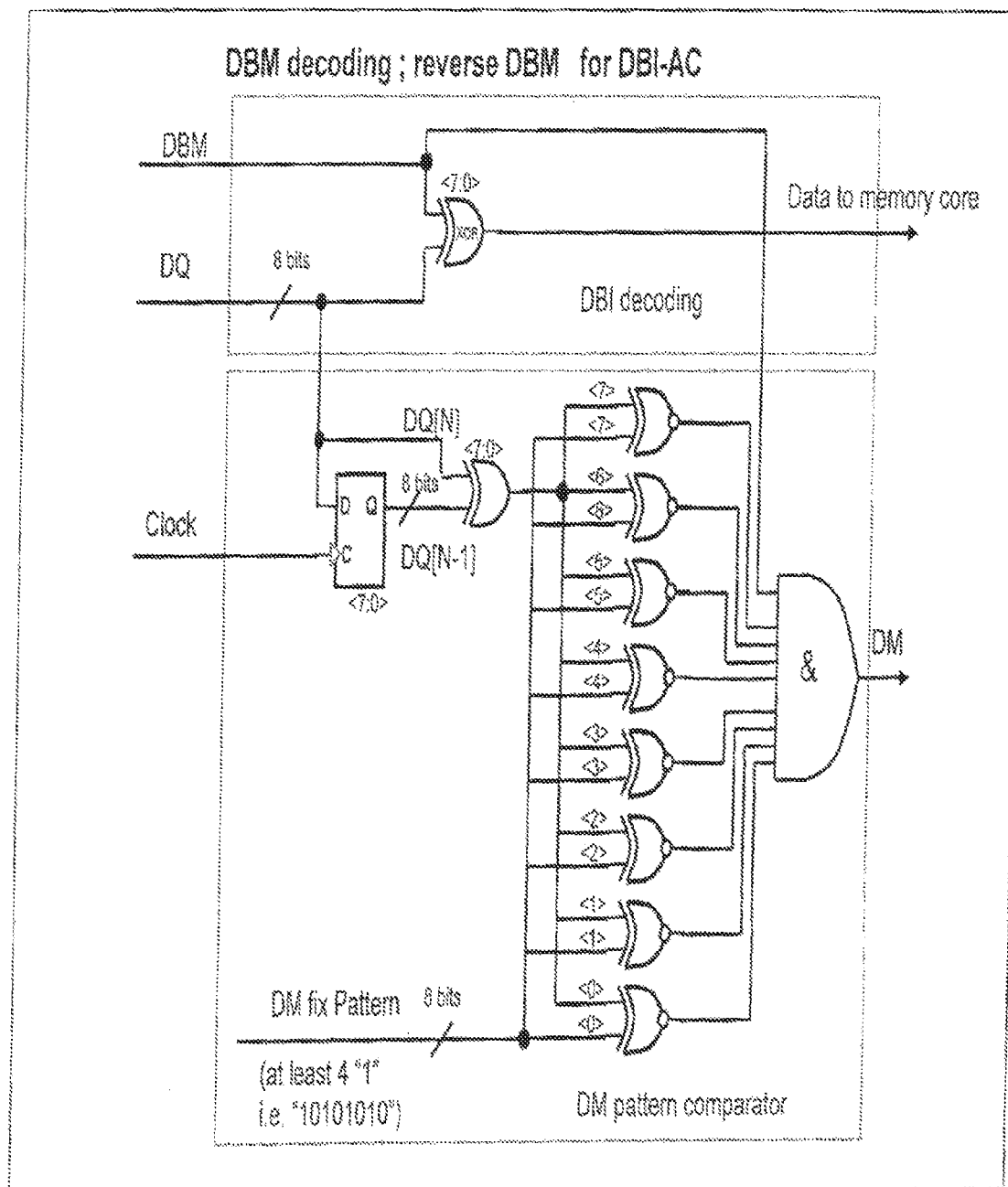
FIG. 17 depicts an exemplary circuit for implementing the DM detector for Type II decoding in the DBI-AC scheme according to an embodiment.

To decode the data word itself according to DBI-AC rules the circuit components depicted in FIG. 5b may still be used. A DM detector circuit can be added to facilitate detection of a data mask instruction. As with the embodiments described above for the DBI-DC scheme, decoding the mask information can be performed according to Type I DM code detect or Type II DM code detect. FIGS. 16 and 17 illustrate Type I and FIGS. 18 and 19 illustrate Type II.

FIG. 16 depicts a flow chart illustrating the decode process for Type I. All DQ data bits, Y bit wide, are inverted according to the status of the DBM. To decode the encoded mask information from the DBI-AC data stream, it is necessary to store the data from the previous cycle DQ[N−1] so that it can be bit wise compared with the new incoming data DQ[N]. The bit wise compare result DQ[N] to DQ[N−1] is than compared to the fixed data mask pattern. If the compare is true, and DBM is 1, data are masked and no data is written.

FIG. 17 depicts an exemplary circuit for implementing the DM detector according to Type I. The DQ[N−1] signals from the previous cycle are stored in flip-flops or the tike. The output of the flip-flops DQ[N−1] is than XOR'ed with the incoming DQ[N] signals, the results constituting bit wise change information. The change information is then bit wise compared to the predefined DM-pattern. If the compare to the DM-pattern positive and DBM is also one (active), the DM signal to the memory core is set to active, which instructs to mask the data. Otherwise, the DM signal is inactive, instructing not to mask the data.

Figure 18:
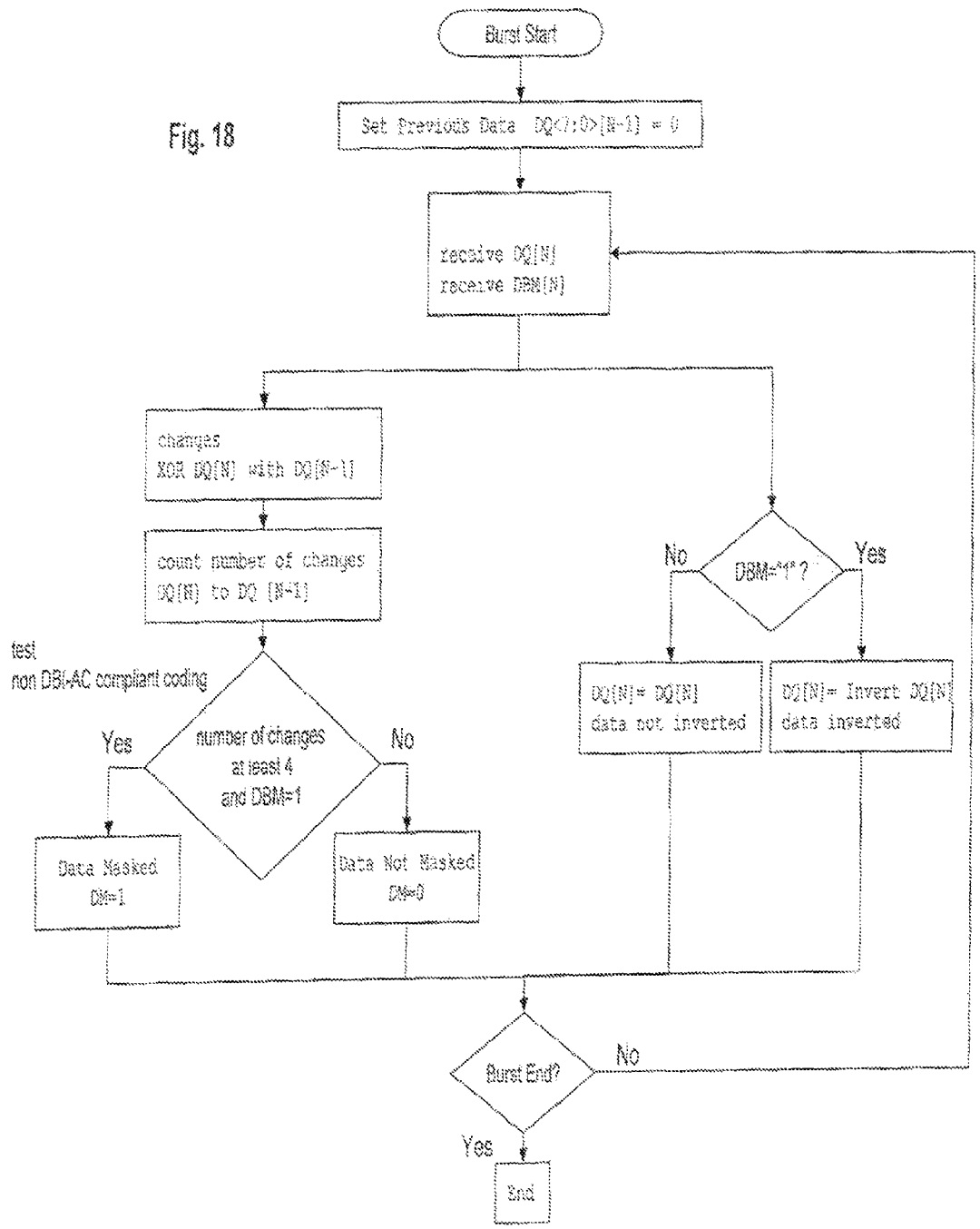
FIG. 18 depicts a flow chart illustrating the decode process for Type II decoding in the DBI-AC scheme according to an embodiment.
Figure 19:
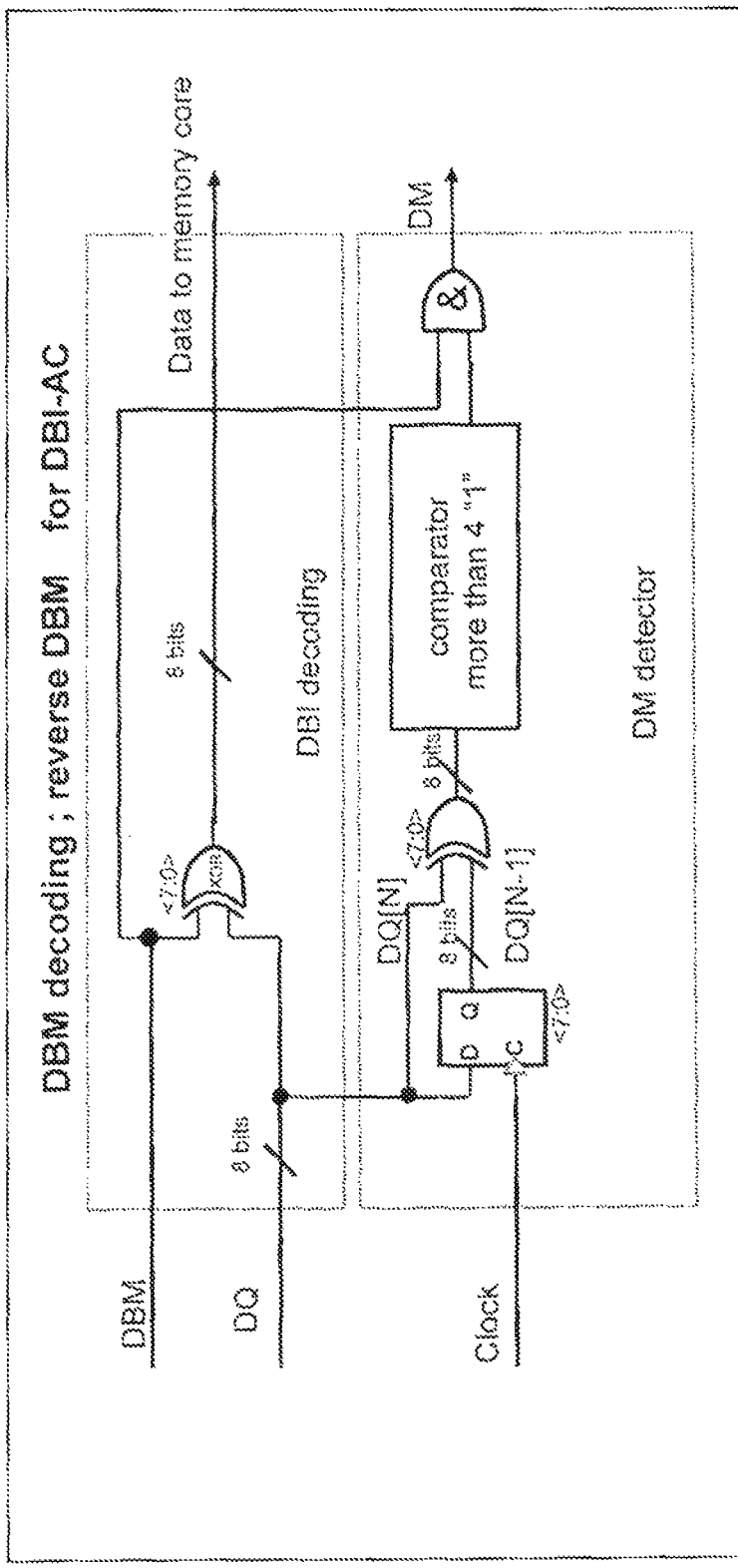
FIG. 19 depicts an exemplary circuit for implementing the DM detector according to Type II decoding in the DBI-AC scheme according to a embodiment.

FIG. 18 depicts a flow chart illustrating the decode process for Type II. All DQ data bits, Y bit wide, are inverted according to the status of the DBM. To decode the encoded mask information from the DBI-AC data stream, it is necessary to store the data from the previous cycle DQ[N−1] in so that it can be bit wise compared with the new incoming data DQ[N].

The bit wise compare result DQ[N] to DQ[N-1] is than counted bit wise, effectively counting the number of DQ changes from one cycle to the next cycle. If the number of changes is at least Y/2 and DBM=1, this combination signals invalid DBI-AC encoding and the DM signal is set to 1, which instructs to mask the data.

FIG. 19 depicts art exemplary circuit for implementing the DM detector according to Type II. The DQ[N-1] signals from the previous cycle are stored in flip-flops or the like. The output of the flip-flops DQ[N-1] is than XOR'ed with the incoming DQ[N] signals, the results constituting bit wise change information. This change information is evaluated in the comparator. If the number of 1s is at least four, the circuit generates a 1; otherwise it generates a 0. If the compare is positive and DBM is also 1, the DM signal to the memory core is set to active, which instructs to mask the data.

As previously mentioned, to improve the robustness of the data mask and DBI encoding, it preferable to use an encoding with more than Y/2 data changes relative to the previous cycle. With this encoding single bit transmission errors can be recovered in the mask encoding and data masking can still be properly detected. This can be useful since false mask information to the memory core cannot be recovered with retry methods.

EXAMPLE 2

FIG. 20 depicts a table providing an example of several data transfers according to an embodiment using a DBI-AC scheme. Processing for both Type I and Type II DM code detection can be illustrated using this figure.

For Type I, the data mask is represented in this figure by a fixed data change pattern of 10101010 on the DQ pins and a logical "1" on the DM pin. This represents a noncompliant pattern under the DBI-AC scheme because it indicates that there were four transitions (a transition being represented by a logical "1") yet the DM pin is set to logical "1". Since four transitions would not require inversion, the DM pin should be a logical "0" rather than a logical "1". Thus, this pattern is noncompliant. Of course, this pattern is just an example and other noncompliant patterns may be used as the fixed data change pattern.

For Type II, the data mask can be represented by any noncompliant data change pattern any pattern in which there are five or more transitions or exactly four transitions and a logical "1" on the DBM pin). For simplicity, in this example the encoded noncompliant pattern will be DQ=10101010 and DBM=1. Of course, while the noncompliant patterns for Type I and Type II are the same here, the methods of detecting that the pattern represents a data mask instruction are different.

Referring again to FIG. 20, block A represents the raw data to be transmitted. In this example, one byte [D7:D0] is transferred per cycle. The cycles are counted from T=0 to T=10, with cycle T=0 being an initialization cycle with no actual data transfer. The line labeled "Data Mask" indicates whether the data mask signal was enabled (N=No, Y=Yes).

Block B represents the data that is actually transmitted on the bus after the DBI-AC encoding process. Thus, if the data is to be masked, a data word is transmitted such that the change pattern (as shown in block C) plus the DBM bit is noncompliant. If the data is not to be masked, the original data from block A is transmitted as is or inverted according to the DBI-AC scheme.

Block C represents the DQ state change (the change pattern) from one cycle to the next cycle. This is required for data mask detection according to both Type I and Type II DM code detection. Block D represents the result of a pattern match operation the receiver according to the Type encoding. Block E represents the result of the pattern match operation at the receiver according to the Type II encoding. Block E lists the DQ change count, the DBM level, and the sum of the two. Note that the columns for T=1, 2, 6, 8, and 9 are blank because DBM is not asserted and therefore neither bus inversion nor data masking are performed in this example. Finally, block F represents the data to be written to the memory core. Data masking is indicated with shading since no data is to be written in that circumstance.

At time T=0 the bus is initialized with DQ=00000000 and DBM=0.

At time T=1 the data word 00001111 is to be transmitted with no data mask. Four bits in this data word are different compared to the bus state at T=0 (that is the bus state as indicated in column B at T=0). Therefore the data word 00001111 is transmitted non-inverted as 00001111, and DBM=0. The receiver does not invert the received data word since DBM=0. For Type I DM code detection, the receiver detects that the data change pattern (T1 in block C) does not match the 10101010 pattern for indicating data mask. For Type II DM code detection, the receiver detects a DBI-AC compliant state since there are four data transitions but a logical '0' on the DBM. According, the data word 00001111 is written to the memory core.

At time T=2 the data word 11111111 is to be transmitted with no data mask. Four bits in this data word are different compared to the bus state at T=1. Therefore the data word 11111111 is transmitted non-inverted as 11111111, and DBM is set to 0. The receiver does not invert the received data word since DBM=0. For Type I DM code detection, the receiver detects that the data change pattern does not match the 10101010 pattern for indicating data mask. For Type II DM code detection, the receiver detects a DBI-AC compliant state since there are four data transitions but a logical "0" on the DBM. Accordingly, the data word 11111111 is written to the memory core.

At time T=3 the data word 00000000 is to be transmitted with no data mask. Eight bits in this data word are different compared to the bus state at T=2. Therefore the data word 00000000 is inverted and transmitted as 11111111, and DBM is set to 1 to indicate the inversion. The receiver inverts the received data word to 00000000 since DBM=1. For Type I DM code detection, the receiver detects that the data change pattern does not match the 10101010 pattern for indicating data mask. For Type II DM code detection, the receiver detects a DBI-AC compliant state since there are zero data transitions. Accordingly, the data word 00000000 is written to the memory core.

At time T=4 the data word 11111111 is to be transmitted with data mask. Thus, the pattern 01010101 is transmitted instead of the original data word, and DBM is set to 1. The pattern 01010101 is transmitted so that the data change pattern when comparing this transmitted pattern to the pattern from the previous cycle (T=3) is 10101010. For Type I DM code detection, the receiver detects that the data change on the DQ matches the 10101010 pattern for indicating data mask. This in conjunction with DBM=1 signifies a data mask instruction. For Type II DM code detection, the receiver determines a DQ change count of four. This in conjunction with DBM=1 signifies a data mask instruction. Accordingly, the transmitted data word is masked and not written to the memory core under either Type I or Type II DM code detection.

At time T=5 the data word 00001111 is to be transmitted with data mask. Thus, the pattern 11111111 is transmitted instead of the original data word, and DBM is set to 1. In this case, the pattern 11111111 is transmitted so that the data change pattern when comparing this transmitted pattern to the pattern from the previous cycle (T=4) is 10101010. For Type I DM code detection, the receiver detects that the data change on the DQ matches the 10101010 pattern for indicating data mask. This in conjunction with DBM=1 signifies a data mask instruction. For Type II DM code detection, the receiver determines a DQ change count of four. This in conjunction with DBM=1 signifies a data mask instruction. Accordingly, the transmitted data word is masked and not written to the memory core under either Type I or Type II DM code detection.

At time T=6 the data word 00001111 is to be transmitted with no data mask. Four bits in this data word are different compared to the bus state at T=5. Therefore the data word 00001111 is transmitted non-inverted as 00001111, and DBM is set to 0. The receiver does not invert the received data word since DBM=0. For Type I DM code detection, the receiver detects that the data change pattern does not match the 10101010 pattern for indicating data mask. For Type II DM code detection, the receiver detects a DBI-AC compliant state since there are four data transitions but a logical "0" on the DBM. Accordingly, the data word 00001111 is written to the memory core.

At time T=7 the data word 11110000 is to be transmitted with no data mask. Eight bits in this data word are different compared to the bus state at T=6. Therefore the data word 11110000 is transmitted inverted as 00001111, and DBM is set to 1. The receiver inverts the received data word back to 11110000 since DBM=1. For Type I DM code detection, the receiver detects that the data change pattern does not match the 10101010 pattern for indicating data mask. For Type II DM code detection, the receiver detects a DBI-AC compliant state since there are zero data transitions. Accordingly, the data word 11110000 is written to the memory core.

At time T=8 the data word 00111100 is to be transmitted with no data mask. Four bits in this data word are different compared to the bus state at T=7. Therefore the data word 00111100 is transmitted non-inverted as 00111100, and DBM is set to 0. The receiver does not invert the received data word since DBM=0. For Type I DM code detection, receiver detects that the data change pattern does not match the 10101010 pattern for indicating data mask. For Type II DM code detection, the receiver detects a DBI-AC compliant state since there are four data transitions but DBM=0. Accordingly, the data word 00111100 is written to the memory core.

At time T=9 the data word 00000000 is to be transmitted with no data mask. Four bits in this data word are different compared to the bus state at T=8. Therefore the data word 00000000 is transmitted noninverted as 00000000 and DBM is set to 0. The receiver does not invert the received data word since DBM=0. For Type I DM code detection, the receiver detects that the data change pattern does not match the 10101010 pattern for indicating data mask. For Type II DM code detection, the receiver detects a DBI-AC compliant state since there are four data transitions but DBM=0. Accordingly, the data word 00000000 is written to the memory core.

At time T=10 the data word 00001111 is to be transmitted with data mask. The pattern 10101010 is transmitted instead of the original data word, and DBM is set to 1. The pattern 10101010 is transmitted so that the data change pattern when comparing this transmitted pattern to the pattern from the previous cycle (T=9) is 10101010. For Type I DM code detection, the receiver detects that the data change on the DQ matches the 10101010 pattern for indicating data mask. This in conjunction with DBM=1 signifies a data mask instruction. For Type II DM code detection, the receiver determines a DQ change count of four. This in conjunction with DBM=1 signifies a data mask instruction. Accordingly, the transmitted data word is masked and not written to the memory core under either Type I or Type II DM code detection.

One skilled in the relevant art will recognize that many possible modifications and combinations of the disclosed embodiments can be used, while still employing the same basic underlying mechanisms and methodologies. The foregoing description, for purposes of explanation, has been written with references to specific embodiments. However, the illustrative discussions above are not intended to be exhaustive or to limit the disclosure to the precise forms disclosed. Many modifications and variations can be possible in view of the above teachings. The embodiments were chosen and described to explain the principles of the disclosure and their practical applications, and to enable others skilled in the art to utilize the disclosure and various embodiments with various modifications as suited to the particular use contemplated.

Furthermore, while this specification contains many specifics, these should not be construed as limitations on the scope of what is being claimed or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A memory device comprising:
   a memory core;
   a plurality of data bit input pins;
   a data bit inversion (DBI) input pin;
   a decoder configured to receive a data word from the plurality of data bit input pins and a DBI signal from the DBI input pin, and output a decoded data word, wherein the decoded data word is inverted with respect to the received data word when the DBI signal indicates inversion is to be performed and is the same as the received data word when the DBI signal indicates inversion is not to be performed; and
   data mask code detection logic configured to receive the data word from the plurality of data bit input pins and the DBI signal from the DBI input pin in parallel with the decoder, determine whether the received data word is encoded in a compliant or noncompliant state, and output a data mask signal, wherein the data mask signal has a first state that indicates data masking is to be performed when the received data word is determined to be in a noncompliant state and a second state that indicates data masking is not to be performed when the received data word is determined to be in a compliant state, wherein the determination of whether the received data word is encoded in the compliant or noncompliant state depends at least partially upon the logic state of the DBI signal;
   wherein the decoded data word is allowed to be written to the memory core when the data mask signal has the second state and is not allowed to be written to the memory core when the data mask signal has the first state.

2. The memory device of claim 1, wherein the determination of whether the received data word is encoded in the compliant or noncompliant state by the data mask code detection logic further depends on a number of occurrences of a first logic level in the bits of the data word exceeds a predetermined limit.

3. The memory device of claim 2, wherein the first logic level is a logical 0, and the received data word is noncompliant when the number of logical 0s in the received data word exceeds the predetermined limit.

4. The memory device of claim 2, wherein the predetermined limit is one half the bits in the data word.

5. The memory device of claim 1, wherein the determination of whether the received data word is encoded in the compliant or noncompliant state by the data mask code detection logic further depends on whether the bits of the received data word matches a predetermined bit pattern.

6. The memory device of claim 1, wherein the determination of whether the received data word is encoded in the compliant or noncompliant state by the data mask code detection logic further depends on the number of bits in the received data word that are different than the bits in a preceding received data word.

7. The memory device of claim 6, wherein the received data word is determined to be compliant when fewer than one half of the bits in the received data word are different than the bits in the preceding received data word.

8. The memory device of claim 1, wherein the data mask code detection logic comprises:
a first input that receives the data word from the plurality of data bit pins;
a second input that receives the DBI signal from the DBI input pin;
a counter configured to determine a number of occurrences of a first logic level in the bits of the received data word and to output a counter signal with a third state when the number of times the first logic level occurs in the data word is at least equal to a predetermined number and a fourth state when the number of times the first logic level occurs in the data word is less than the predetermined number; and
an AND logic gate that receives the DBI signal as a first input and the counter signal as the second input, and outputs the data mask signal based on the state of the DBI signal and the counter signal.

9. The memory device of claim 8, wherein the data mask signal has the second state indicating that data masking is not to be performed, when either the DBI signal is not asserted or the counter signal indicates the fourth state.

10. A system comprising:
a memory controller; and
a memory device communicatively coupled to the memory controller, the memory device including:
a memory core;
a plurality of data bit input pins;
a data bit inversion (DBI) input pin;
a decoder configured to receive a data word from the plurality of data bit input pins and a DBI signal from the DBI input pin, and output a decoded data word, wherein the decoded data word is inverted with respect to the received data word when the DBI signal indicates inversion is to be performed and is the same as the received data word when the DBI signal indicates inversion is not to be performed; and
data mask code detection logic configured to receive the data word from the plurality of data bit input pins and the DBI signal from the DBI input pin in parallel with the decoder, determine whether the received data word is encoded in a compliant or noncompliant state, and output a data mask signal, wherein the data mask signal has a first state that indicates data masking is to be performed when the received data word is determined to be in a noncompliant state and a second state that indicates data masking is not to be performed when the received data word is determined to be in a compliant state, wherein the determination of whether the received data word is encoded in the compliant or noncompliant state depends at least partially upon the logic state of the DBI signal;
wherein the decoded data word is allowed to be written to the memory core when the data mask signal has the second state and is not allowed to be written to the memory core when the data mask signal has the first state.

11. The system of claim 10, wherein the determination of whether the received data word is encoded in the compliant or noncompliant state by the data mask code detection logic further depends on a number of occurrences of a first logic level in tile bits of the data word exceeds a predetermined limit.

12. The system of claim 11, wherein the first logic level is a logical 0, and the received data word is noncompliant when the number of logical 0s in the received data word exceeds the predetermined limit.

13. The system of claim 11, wherein the predetermined limit is one half the bits in the data word.

14. The system of claim 10, wherein the determination of whether the received data word is encoded in the compliant or noncompliant state by the data mask code detection logic further depends on whether the bits of the received data word matches a predetermined bit pattern.

15. The system of claim 10, wherein the determination of whether the received data word is encoded in the compliant or noncompliant state by the data mask code detection logic further depends on the number of bits in the received data word that are different than the bits in a preceding received data word.

16. The system of claim 15, wherein the received data word is determined to be compliant when fewer than one half of the bits in the received data word are different than the bits in the preceding received data word.

17. A memory device comprising:
a memory core;
a plurality of data bit input pins;
a data bit inversion (DBI) input pin;
a decoder configured to receive a data word from the plurality of data bit input pins and a DBI signal from the DBI input pin, and output a decoded data word, wherein the decoded data word is inverted with respect to the received data word when the DBI signal indicates inversion is to be performed and is the same as the received data word when the DBI signal indicates inversion is not to be performed; and
data mask code detection logic configured to receive the data word from the plurality of data bit input pins and the DBI signal from the DBI input pin in parallel with the decoder, determine whether the received data word is encoded in a compliant or noncompliant state, and output a data mask signal, wherein the data mask signal has a first state that indicates data masking is to be performed when the received data word is determined to be in a noncompliant state and a second state that indicates data masking is not to be performed when the received data word is determined to be in a compliant state, wherein the determination of whether the received data word is encoded in the compliant or noncompliant state depends at least partially on the number of bits in the received data word that are different than the bits in a preceding received data word;

wherein the decoded data word is allowed to be written to the memory core when the data mask signal has the second state and is not allowed to be written to the memory core when the data mask signal has the first state.

18. The memory device of claim 17, wherein the determination of whether the received data word is encoded in the compliant or noncompliant state further depends on the logic state of the DBI signal.

19. The memory device of claim 17, wherein the data mask code detection logic comprises:
- a first input that receives the data word from the plurality of data bit pins;
- a flip flop that stores the preceding received data word; and
- an XOR logic gate that compares the received data word to the preceding received data word and outputs bit wise change information;
- wherein the bit wise change information evaluated by a comparator, and the output of the comparator along with the DBI signal are evaluated to determine the state of the data mask signal.

* * * * *